(12) United States Patent
Park et al.

(10) Patent No.: US 11,721,718 B2
(45) Date of Patent: Aug. 8, 2023

(54) DISPLAY DEVICE AND METHOD OF FABRICATING THE SAME

(71) Applicant: LG Display Co., Ltd., Seoul (KR)

(72) Inventors: Joonyeong Park, Gimpo-si (KR); Taeil Jung, Goyang-si (KR); Il-Soo Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 90 days.

(21) Appl. No.: 17/206,011

(22) Filed: Mar. 18, 2021

(65) Prior Publication Data

US 2021/0210547 A1 Jul. 8, 2021

Related U.S. Application Data

(62) Division of application No. 16/548,535, filed on Aug. 22, 2019, now Pat. No. 10,985,208.

(30) Foreign Application Priority Data

Aug. 23, 2018 (KR) ......................... 10-2018-0098322

(51) Int. Cl.
*H01L 27/15* (2006.01)

(52) U.S. Cl.
CPC ................ *H01L 27/156* (2013.01)

(58) Field of Classification Search
CPC ....... H01L 27/156; H01L 33/60; H01L 33/10; H01L 33/38; H01L 33/504; H01L 33/58; H01L 33/62; H01L 51/50–56; H01L 51/0032–0095; H01L 2251/50–568; H01L 33/00–648; H10K 50/00–88; H10K 59/00–95; H10K 71/00–861; H10K 2102/00–361; H10K 85/00–791; H10K 2101/00–90

See application file for complete search history.

(56) References Cited

U.S. PATENT DOCUMENTS

| | | | |
|---|---|---|---|
| 10,193,042 B1* | 1/2019 | Tsai | ...................... H01L 33/505 |
| 2007/0207571 A1 | 9/2007 | Morisue et al. | |
| 2009/0207349 A1 | 8/2009 | Yoshimi et al. | |
| 2010/0013741 A1 | 1/2010 | Watanabe | |
| 2013/0130440 A1 | 5/2013 | Hu et al. | |

(Continued)

FOREIGN PATENT DOCUMENTS

KR 10-2012-0086485 A 8/2012
KR 20170142022 A 12/2017

*Primary Examiner* — Shahed Ahmed
(74) *Attorney, Agent, or Firm* — Seed IP Law Group LLP

(57) ABSTRACT

There is provided a display device. The display device includes a plurality of semiconductor elements disposed on a substrate; a plurality of LEDs disposed on the plurality of semiconductor elements and electrically connected to the plurality of semiconductor elements, respectively; and a plurality of reflectors disposed above the semiconductor elements and each located between every two of the LEDs. The plurality of LEDs may include a plurality of respective light-emitting layers disposed on the plurality of semiconductor elements, and a common electrode disposed on the plurality of light-emitting layers. The reflectors are disposed between the LEDs, so that light emitted from LEDs does not travel toward the side portions of the LEDs but toward the above of the substrate, thereby improving the light extraction efficiency and suppressing color mixture.

17 Claims, 17 Drawing Sheets

(56) References Cited

U.S. PATENT DOCUMENTS

| | | | |
|---|---|---|---|
| 2017/0005144 A1* | 1/2017 | Akagawa | G02B 27/0172 |
| 2017/0069612 A1 | 3/2017 | Zhang et al. | |
| 2017/0153766 A1 | 6/2017 | Kimura et al. | |
| 2018/0166429 A1 | 6/2018 | Chong et al. | |
| 2018/0331316 A1* | 11/2018 | Lee | H01L 51/5036 |
| 2019/0074324 A1 | 3/2019 | Kim et al. | |
| 2019/0302917 A1 | 10/2019 | Pan | |
| 2019/0305036 A1 | 10/2019 | Ahn et al. | |
| 2019/0364631 A1* | 11/2019 | Lee | H01L 33/62 |

* cited by examiner

DISPLAY DEVICE AND METHOD OF FABRICATING THE SAME

CROSS-REFERENCE TO RELATED APPLICATION

This application is a divisional of U.S. patent application Ser. No. 16/548,535, filed on Aug. 22, 2019, which claims the benefit of Korean Patent Application No. 10-2018-0098322 filed on Aug. 23, 2018, which applications are hereby incorporated by reference as if fully set forth herein.

BACKGROUND

Technical Field

The present disclosure relates to a display device and a method of fabricating the display device, and more particularly, to a display device using micro light-emitting diodes (LEDs) and a method of fabricating the display device.

Description of the Related Art

Display devices employed by the monitor of a computer, a TV, a mobile phone or the like includes an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger display area with reduced volume and weight.

Recently, display devices including LEDs are attracting attention as the next generation display device. An LED is made of an inorganic material instead of an organic material, and therefore has excellent reliability and a longer lifetime than a liquid-crystal display device or an organic light-emitting display device. In addition, the LEDs can be turned on and off quickly, have high luminous efficiency, are robust to impact and stable, and can display a high-brightness image.

BRIEF SUMMARY

To fabricate LEDs, an epitaxial layer is grown on a single wafer and the epitaxial layer is patterned. Then, the LEDs fabricated on the wafer are transferred to a backplane substrate to form a display panel.

For example, LEDs are aligned with semiconductor elements on the backplane substrate and a transfer process is carried out by thermocompression at a high temperature or the like, such that the LEDs can be transferred to the backplane substrate. However, the thermal expansion coefficient of the wafer on which the LEDs are grown is different from that of the backplane substrate. Accordingly, the degree of expansion of the wafer and the degree of expansion of the backplane substrate may be different from each other when high-temperature heat is applied during the transferring process. Therefore, even if the transfer process is carried out after the LEDs are aligned with the semiconductor elements of the backplane substrate, the aligned positions of the LEDs and the semiconductor elements may be shifted due to such a difference in thermal expansion coefficient between the wafer and the backplane substrate. As a result, there is a problem in that a contact failure may occur between the LEDs and the semiconductor elements.

The inventors of the present disclosure have recognized that misalignment occurs between the LEDs and semiconductor elements due to a difference in thermal expansion coefficient between the wafer and the backplane substrate when the LEDs on the wafer are bonded to the backplane substrate as described above. In view of the above, the inventors of the present disclosure have devised a display device that can improve the problem arising during a process of transferring LEDs, and a method of fabricating a display device.

Incidentally, in order to display high-resolution images, it is advantageous that the size of the LEDs is reduced. For example, a high-resolution display panel can be implemented by employing micro LEDs in a micro size. However, in order to align micro LEDs with semiconductor elements, a very precise transfer technique is required.

Accordingly, the inventors of the present disclosure have devised a display device in which LEDs having an ultra-small size can be aligned with semiconductor elements more precisely, and a method of fabricating the display device.

In view of the above, an embodiment of the present disclosure provides a display device with improved alignment accuracy between LEDs and semiconductor elements, and a method of fabricating the display device.

Another embodiment of the present disclosure provides a display device that can avoid misalignment by way of forming LEDs directly on a backplane substrate, and a method of fabricating the display device.

Another embodiment of the present disclosure provides a display device that can avoid misalignment due to a difference in thermal expansion coefficient between a wafer where an epitaxial layer for LEDs is grown and a backplane substrate by way of bonding the epitaxial layer before the LEDs are formed on semiconductor elements of the backplane substrate, and a method of fabricating the display device.

Another embodiment of the present disclosure provides a display device in which LEDs can be arranged at uniform spacing by way of forming an epitaxial layer on semiconductor elements on a backplane substrate and then patterning them into individual LEDs, and a method of fabricating the display device.

Another embodiment of the present disclosure provides a display device with improved precision by way of forming LEDs in an ultra-small size, and a method of fabricating the display device.

Yet another embodiment of the present disclosure provides a display device that can reduce processing time by way of forming a plurality of LEDs on a backplane substrate at once, instead of transferring the LEDs on the backplane substrate one by one, and a method of fabricating the display device.

Another embodiment of the present disclosure provides a display device that can reduce color mixture and improve light extraction efficiency, and a method of fabricating the display device.

Embodiments of the present disclosure are not limited to the above-mentioned embodiments, and other embodiments, which are not mentioned above, can be clearly understood by those skilled in the art from the following descriptions.

According to an aspect of the present disclosure, there is provided a display device including: a plurality of semiconductor elements disposed on a substrate; a plurality of LEDs disposed on the plurality of semiconductor elements and electrically connected to the plurality of semiconductor elements, respectively; and a plurality of reflectors disposed above the semiconductor elements and each located between every two of the LEDs. The plurality of LEDs may include respective light-emitting layers disposed on the plurality of semiconductor elements, and a common electrode disposed on the plurality of light-emitting layers. The reflectors are disposed between the LEDs, so that light emitted from LEDs does not travel toward the side portions of the LEDs but toward the above of the substrate, thereby improving the light extraction efficiency and suppressing color mixture.

According to another aspect of the present disclosure, there is provided a method of fabricating a display device, the method comprising: forming a plurality of semiconductor elements on a first substrate; forming an epitaxial layer on a second substrate; bonding the first substrate and the second substrate together such that the plurality of semiconductor elements of the first substrate face the epitaxial layer of the second substrate; separating the second substrate from the epitaxial layer; etching parts of the epitaxial layer to form a plurality of second semiconductor layers, a plurality of light-emitting layers under the second semiconductor layers, and a plurality of first semiconductor layers under the light-emitting layers; forming a plurality of reflectors where the parts of the epitaxial layer are etched; and forming a common electrode so that it covers the second semiconductor layers and the reflectors. The second semiconductor layers, the light-emitting layers, the first semiconductor layers and the common electrode may form a plurality of LEDs, respectively. Therefore, an epitaxial layer is bonded on a plurality of semiconductor elements and a plurality of LEDs is formed directly thereon, and thus it is possible to omit a transfer process that is previously carried out, and to easily align the LEDs with semiconductor elements.

Other detailed matters of the exemplary embodiments are included in the detailed description and the drawings.

According to an exemplary embodiment of the present disclosure, it is possible to avoid misalignment due to a difference in thermal expansion coefficient between a substrate where LEDs are formed and a substrate where semiconductor elements are formed.

According to an exemplary embodiment of the present disclosure, LEDs are formed directly on the substrate where semiconductor elements are formed, so that it is possible to omit a process of transferring the LEDs onto the substrate where the semiconductor elements are formed one by one, and to reduce the processing time.

According to an exemplary embodiment of the present disclosure, it is possible to achieve a high-resolution display device by way of implementing LEDs in an ultra-small size.

According to an exemplary embodiment of the present disclosure, it is possible to suppress the color mixture between the LEDs and to improve light extraction efficiency.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
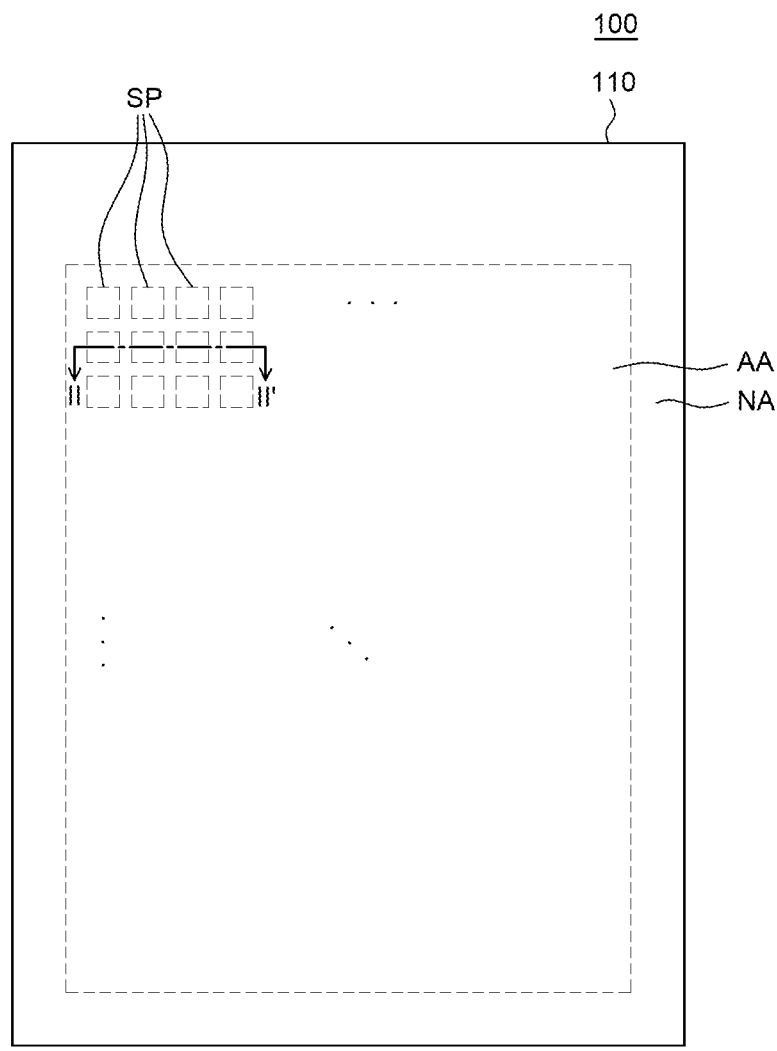
FIG. 1 is a schematic plan view of a display device according to an exemplary embodiment of the present disclosure.

Advantages and features of the present disclosure and methods to achieve them will become apparent from the descriptions of exemplary embodiments herein below with reference to the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a display device according to an exemplary embodiment of the present disclosure. For convenience of illustration, FIG. 1 shows only a first substrate 110 and sub-pixels SP among a variety of elements of a display device 100.

The first substrate 110 supports a variety of elements included in the display device 100 and may be made of an insulating material. For example, the first substrate 110 may be made of glass, a resin or the like. In addition, the first substrate 110 may be made of a material including polymer or plastic, or may be made of a material having flexibility.

The first substrate 110 includes an active area AA and a non-active area NA.

The active area AA is defined as an area for displaying an image, in which a plurality of sub-pixels SP is disposed. In each of the plurality of sub-pixels SP in the active area AA, a light-emitting element and driving circuitry for driving the light-emitting element may be disposed. For example, in each of the plurality of sub-pixels SP, LEDs, semiconductor elements for driving the LEDs, etc., may be disposed.

The non-active area NA is defined as an area where no image is displayed, and a variety of lines, driving ICs, and the like for driving the sub-pixels SP disposed in the active area AA are disposed therein. For example, a variety of ICs such as a gate driver IC and a data driver IC may be disposed in the non-active area NA. On the other hand, the non-active area NA may be located on the rear surface of the first substrate 110, i.e., the surface on which no sub-pixel SP is disposed, or may be eliminated.

In the active area AA of the first substrate 110, a plurality of sub-pixels SP is defined. Each of the plurality of sub-pixels SP is a unit that emits light. In each of the sub-pixels SP, an LED and a semiconductor element are formed. For example, the plurality of sub-pixels SP may include, but is not limited to, red sub-pixels, green sub-pixels, and blue sub-pixels.

Hereinafter, the sub-pixels SP will be described in more detail with respect to FIG. 2.

Figure 2:
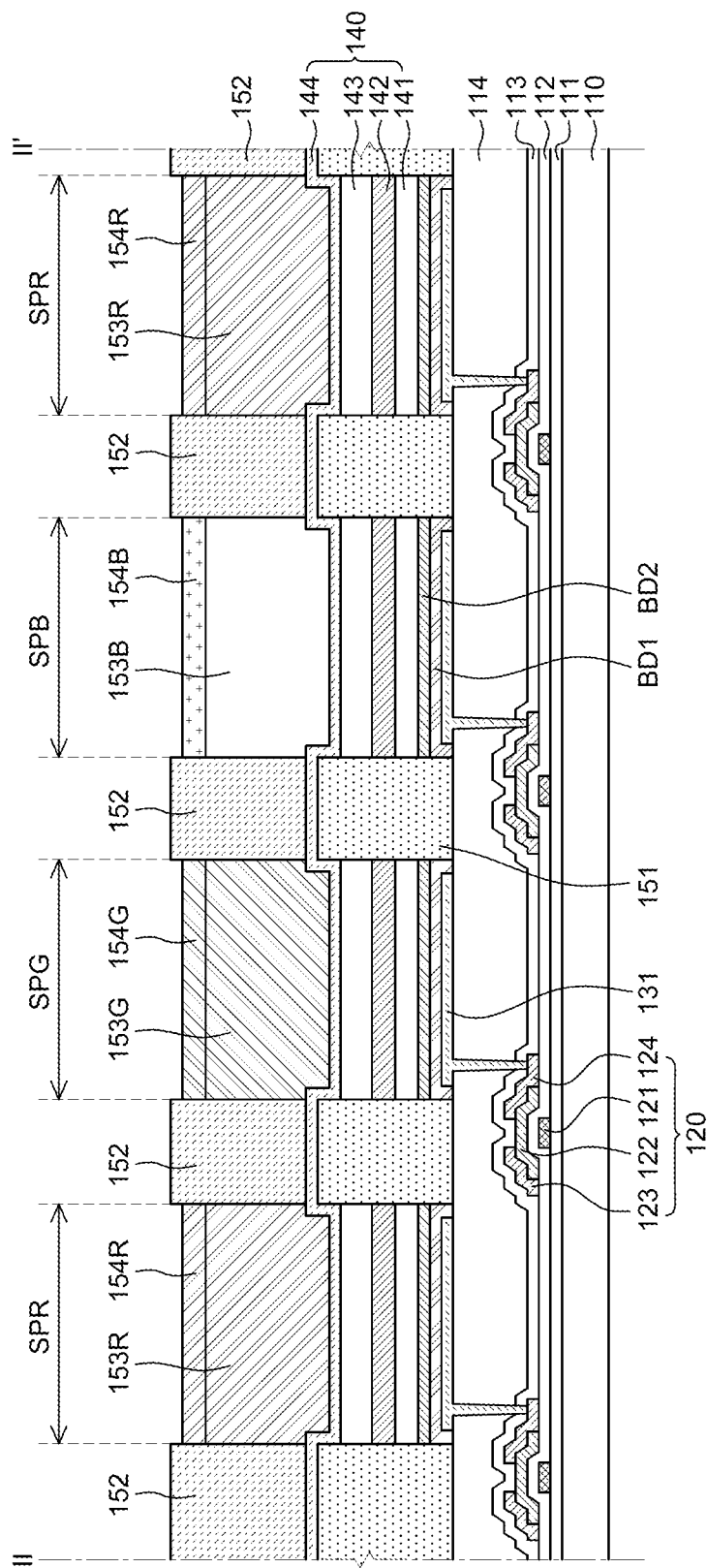
FIG. 2 is a cross-sectional view taken along line II-II' of FIG. 1.

FIG. 2 is a cross-sectional view taken along line II-II' of FIG. 1. Referring to FIG. 2, the display device 100 according to the exemplary embodiment of the present disclosure includes a first substrate 110, a buffer layer 111, a gate insulating layer 112, a passivation layer 113, a planarization layer 114, a plurality of semiconductor elements 120, a plurality of connection electrodes 131, a plurality of first bonding electrodes BD1, a plurality of second bonding electrodes BD2, a plurality of LEDs 140, a plurality of reflectors 151, a plurality of light-blocking layers 152, a plurality of light conversion layers 153R, 153G and 153B, and a plurality of color filters 154R, 154G and 154B.

The buffer layer 111 is disposed on the first substrate 110. The buffer layer 111 can suppress the diffusion of moisture or impurities from the first substrate 110. The buffer layer 111 may be made up of, but is not limited to, a single layer or a plurality of layers of silicon oxide (SiOx) or silicon nitride (SiNx).

The plurality of semiconductor elements 120 is disposed on the buffer layer 111. The semiconductor elements 120 may work as driving elements of the display device 100. Each of the semiconductor elements 120 may be, but is not limited to, a thin-film transistor (TFT), an n-channel metal oxide semiconductor (NMOS), a p-channel metal oxide semiconductor (PMOS), a complementary metal oxide semiconductor (CMOS), a field effect transistor (FET), or the like. In the following description, it is assumed that the semiconductor elements 120 are thin-film transistors. It is, however, to be understood that the present disclosure is not limited thereto.

Each of the semiconductor elements 120 includes a gate electrode 121, an active layer 122, a source electrode 123, and a drain electrode 124.

The gate electrode 121 is disposed on the buffer layer 111. The gate electrode 121 may be made of, but is not limited to, a conductive material, e.g., copper (Cu), aluminum (Al), molybdenum (Mo), titanium (Ti), or an alloy thereof.

A gate insulating layer 112 is disposed over the gate electrode 121. The gate insulating layer 112 is to insulate the gate electrode 121 from the active layer 122 and may be made of an insulating material. For example, the gate insulating layer 112 may be made up of, but is not limited to, a single layer of silicon oxide (SiOx) or silicon nitride (SiNx) or multiple layers thereof.

The active layer 122 is disposed on the gate insulating layer 112. For example, the active layer 122 may be made of, but is not limited to, an oxide semiconductor, amorphous silicon, polysilicon or the like.

The source electrode 123 and the drain electrode 124 are spaced apart from each other and disposed on the active layer 122. The source electrode 123 and the drain electrode 124 may be electrically connected to the active layer 122. The source electrode 123 and the drain electrode 124 may be made of, but is not limited to, a conductive material, e.g., copper (Cu), aluminum (Al), molybdenum (Mo), titanium (Ti), or an alloy thereof.

The passivation layer 113 is disposed on the plurality of semiconductor elements 120. The passivation layer 113 is an insulating layer for protecting the elements under it. For example, the passivation layer 113 may be made up of, but is not limited to, a single layer of silicon oxide (SiOx) or silicon nitride (SiNx) or multiple layers thereof.

The planarization layer 114 is disposed on the passivation layer 113. The planarization layer 114 may provide a flat surface over the first substrate 110 including the plurality of semiconductor elements 120. The planarization layer 114 may be made up of a single layer or multiple layers and may be made of organic material. For example, the planarization layer 114 may be made of, but is not limited to, an acryl based organic material. The planarization layer 114 includes contact holes for electrically connecting the semiconductor elements 120 with the connection electrodes 131, respectively.

The connection electrodes 131 may be disposed on the planarization layer 114. The plurality of connection electrodes 131 may electrically connect the semiconductor elements 120 with the LEDs 140 to be described later. For example, the plurality of connection electrodes 131 may be made of, but is not limited to, tin oxide (TO), indium tin oxide (ITO), indium zinc oxide (IZO), indium zinc tin oxide (ITZO) or the like, or may be made of the same material as the gate electrode 121, the source electrode 123 and the drain electrode 124 of the semiconductor elements 120.

The plurality of first bonding electrodes BD1 and the plurality of second bonding electrodes BD2 are disposed on the plurality of connection electrodes 131. The first bonding electrodes BD1 and the second bonding electrodes BD2 are for bonding the plurality of LEDs 140 to the semiconductor elements 120 to be described later. The first bonding electrodes BD1 and the second bonding electrodes BD2 may be made of, but is not limited to, a eutectic metal such as tin (Sn), indium (In), zinc (Zn), lead (Pb), nickel (Ni), gold (Au), platinum (Pt) and copper (Cu). The first bonding electrodes BD1 and the second bonding electrodes BD2 will be described in detail later with reference to FIGS. 3A to 3O.

The plurality of LEDs 140 are disposed on the second bonding electrodes BD2. Specifically, the LEDs 140 are disposed in the sub-pixels SP, respectively. The LEDs 140 are light-emitting elements that emit light when a voltage is applied thereto. The LEDs 140 include LEDs for emitting red light, green light and blue light. The LEDs 140 can represent a variety of colors including white as they are combined.

The LEDs 140 may have a variety of structures such as a lateral, a vertical and a flip chip structures. The LED having the lateral structure includes a light-emitting layer and an n-type electrode and a p-type electrode arranged on both sides of the light-emitting layer, respectively. The LED having the lateral structure can emit light by combining electrons supplied through the n-type electrode and holes supplied through p-type electrode. The LED having the vertical structure includes an light-emitting layer and an n-type electrode and a p-type electrode arranged on upper and lower sides of the light-emitting layer, respectively. Like the LED having the lateral structure, the LED has the vertical structure can also emit light by the combination of electrons and holes supplied from the electrodes. The LED having the flip chip structure has substantially the same structure as the LED having the lateral structure. It is to be noted that the LED having the flip chip structure may be attached directly to a printed circuit board or the like, without a medium such as a metal wire. In the following description, it is assumed that the LEDs 140 have the vertical structure for convenience of illustration. It is, however, to be understood that the present disclosure is not limited thereto.

Each of the LEDs 140 includes a first semiconductor layer 141, an light-emitting layer 142, a second semiconductor layer 143, and a common electrode 144.

The first semiconductor layer 141 is disposed on the second bonding electrode BD2, and the second semiconductor layer 143 is disposed on the first semiconductor layer 141. The first semiconductor layer 141 and the second semiconductor layer 143 may be formed by implanting n-type or p-type impurities into gallium nitride (GaN). For example, the first semiconductor layer 141 may be a p-type semiconductor layer formed by implanting p-type impurities into gallium nitride. For example, the second semiconductor layer 143 may be an n-type semiconductor layer formed by implanting n-type impurities into gallium nitride. It is, however, to be understood that the present disclosure is not limited thereto. The p-type impurities may be, but is not limited to, magnesium (Mg), zinc (Zn), beryllium (Be), etc. The n-type impurities may be, but is not limited to, silicon (Si), germanium (Ge), tin (Sn), etc.

The light-emitting layer 142 is disposed between the first semiconductor layer 141 and the second semiconductor layer 143. The light-emitting layer 142 may receive holes and electrons from the first semiconductor layer 141 and the second semiconductor layer 143 to emit light. The light-emitting layer 142 may be made up of a single layer or a multi-quantum well (MQW) structure. For example, the light-emitting layer 142 may be made of, but is not limited to, indium gallium nitride (InGaN) or gallium nitride (GaN).

The common electrode 144 is disposed on the second semiconductor layer 143. The common electrode 144 may be used to apply a voltage to the light-emitting layer 142. Specifically, electrons or holes may be supplied to the light-emitting layer 142 through the second semiconductor layer 143 by the common electrode 144. Although the common electrode 144 is disposed across the sub-pixels SP as a single piece and is shared by the plurality of LEDs 140 in the example shown in FIG. 2, the common electrode 144 may be separated from sub-pixel SP to sub-pixel SP. To allow light emitted from the light-emitting layer 142 to pass through it, the common electrode 144 may be made of, but is not limited to, a transparent conductive oxide including indium tin oxide (ITO), indium zinc oxide (IZO), indium tin zinc oxide (ITZO), zinc oxide (ZnO), and tin oxide (TO).

The common electrode 144 may be applied with a common voltage. For example, the common electrode 144 may be extended to the non-active area NA and connected to the driver ICs of the non-active area NA to receive the common voltage, or may be connected to a semiconductor element that receives a voltage from the driver ICs to be applied with the common voltage.

Voltages may be applied to the plurality of LEDs 140 from the plurality of semiconductor elements 120. Specifically, voltages may be applied to the plurality of LEDs 140 from the plurality of semiconductor elements 120 through the connection electrodes 131, the first bonding electrodes BD1 and the second bonding electrodes BD2. Accordingly, the second bonding electrodes BD2 in contact with the first semiconductor layer 141 may serve as pixel electrodes that supply voltage to the light-emitting layer 142 through the first semiconductor layer 141. Accordingly, the LEDs 140 may be defined as including the second bonding electrode BD2. Alternatively, the LEDs 140 may be defined as including the second bonding electrodes BD2 and the first bonding electrodes BD1 or may be defined as including the second bonding electrodes BD2, the first bonding electrodes BD1 and the connection electrodes 131. It is, however, to be understood that the present disclosure is not limited thereto.

The plurality of LEDs 140 may emit light of different colors or light of the same color. For example, when the plurality of LEDs 140 emit light of different colors, the LEDs 140 disposed in the red sub-pixels SPR may be LEDs emitting red light, the LEDs 140 disposed in the green sub-pixels SPG may be LEDs emitting green light, and the LEDs 140 disposed in the blue sub-pixels SPB may be LEDs emitting blue light. If the LEDs 140 emit light of different colors, elements for converting light, such as the light conversion layers 153R, 153G and 153B and the color filters 154R, 154G and 154B may be eliminated.

If the LEDs 140 emit light of the same color, elements for converting light, such as the light conversion layers 153R, 153G and 153B and the color filters 154R, 154G and 154B may be disposed above the LEDs 140, respectively, so that the light emitted from the LEDs 140 can be converted into a variety of colors. In the following description, it is assumed that all of the LEDs 140 emit light of blue. It is, however, to be understood that the present disclosure is not limited thereto.

The reflectors 151 are disposed between the LEDs 140. The reflectors 151 are disposed to be in contact with the side surfaces of the LEDs 140. The space between the LEDs 140 may be filled with the reflectors 151. Each of the reflectors 151 may be disposed at the boundary between two adjacent sub-pixels SP.

The reflectors 151 can reflect light emitted from the LEDs 140 toward the above of the first substrate 110 to improve the light efficiency of the LEDs 140. For example, the reflectors 151 may be, but is not limited to, distributed Bragg reflectors.

Each of the reflectors 151 may also serve as an insulating layer for preventing electrical short-circuit between the first semiconductor layer 141 and the second semiconductor layer 143 in the respective LEDs 140. Specifically, the first semiconductor layer 141 and the second semiconductor layer 143 of each of the LEDs 140 may be electrically connected to different electrodes to supply electrons and holes to the light-emitting layer 142. For example, the first semiconductor layer 141 may be electrically connected to the second bonding electrode BD2, and the second semiconductor layer 143 may be electrically connected to the common electrode 144. If the common electrode 144 is brought into contact with the first semiconductor layer 141 as well as the second semiconductor layer 143, an electrical short-circuit may be created. In view of the above, in order to prevent a short-circuit between the first semiconductor layer 141 and the second semiconductor layer 143, an insulating layer for insulating the first semiconductor layer 141 from the second semiconductor layer 143 may be further formed. In the display device according to a variety of exemplary embodiments of the present disclosure, each of the reflectors 151 is disposed between the LEDs 140 to serve as an insulating layer to prevent a short-circuit between the LEDs 140.

The height from the planarization layer 114 to the upper surface of the reflectors 151 is larger than the height from the planarization layer 114 to the upper surface of the second semiconductor layer 143 in the example shown in FIG. 2. However, the present disclosure is not limited thereto. The upper surface of the reflectors 151 and the upper surface of the second semiconductor layer 143 may be disposed on the same plane.

The light-blocking layers 152 are disposed on the common electrode 144 so that they overlap the reflectors 151, respectively. In other words, each of the light-blocking layers 152 may be disposed at the boundary between the sub-pixels SP. The light-blocking layers 152 can block the light emitted from the LEDs 140 traveling toward other sub-pixels SP to thereby suppress the color mixture of light. For example, the light-blocking layers 152 may be implemented as, but is not limited to, a black matrix.

The light conversion layers 153R, 153G and 153B are disposed on the common electrode 144. Each of the light conversion layers 153R, 153G and 153B is disposed between the light-blocking layers 152 in the respective sub-pixel SP. Different phosphors may be distributed in the different light conversion layers 153R, 153G and 153B. The light emitted from the LEDs 140 is irradiated to the light conversion layers 153R, 153G and 153B, and the phosphors of the light conversion layers 153R, 153G and 153B absorb light, to emit light of different wavelengths.

For example, the red light conversion layer 153R may be disposed in the red sub-pixel SPR. The blue light emitted from the LEDs 140 may pass through the red light conversion layer 153R and may be converted into red light.

The green light conversion layer 153G may be disposed in the green sub-pixel SPG. The blue light emitted from the LEDs 140 may pass through the green light conversion layer 153G and may be converted into green red light.

The blue light conversion layer 153B may be disposed in the blue sub-pixel SPB. It is to be noted that when the blue light is emitted from the LEDs 140, the blue light conversion layer 153B may be made of a transparent resin, and the blue light emitted from the LEDs 140 may exit toward the above of the first substrate 110 as it is.

The color filters 154R, 154G and 154B are further disposed on the light conversion layers 153R, 153G and 153B, respectively. The color filters 154R, 154G and 154B can improve the purity of the color of the light after it has passed through the light conversion layers 153R, 153G and 153B.

The color filters 154R, 154G and 154B are disposed in line with the light conversion layers 153R, 153G, and 153B of the same colors, respectively. For example, a red color filter 154R may be disposed on the red light conversion layer 153R, a green color filter 154G may be disposed on the green light conversion layer 153G, and a blue color filter 154B may be disposed on the blue color filter 153B. It is to be noted that the color filters 154R, 154G and 154B may be omitted depending on the design of the display device.

In the display device 100 according to the exemplary embodiment of the present disclosure, the reflectors 151 are disposed between the LEDs 140, so that the light extraction efficiency can be improved. Specifically, the light emitted from the LEDs 140 disposed in the respective sub-pixels SP may travel toward the above of the first substrate 110, to display images. If the light emitted from the LEDs 140 is not directed to the above of the first substrate 110 but is directed toward an adjacent sub-pixel SP, issues may arise such as light extraction efficiency and color mixing. In this regard, in the display device 100 according to an exemplary embodiment of the present disclosure, the reflects 151 are disposed between the LEDs 140 and can reflect light emitted from the LED 140 toward the above of the first substrate 100, instead of the side portions of the LEDs 140. Therefore, the display device 110 according to the exemplary embodiment of the present disclosure can improve the light extraction efficiency and suppress the color mixture between the sub-pixels SP.

Hereinafter, the display device 100 according to the exemplary embodiment of the present disclosure and a method of fabricating the display device 100 will be described in detail with reference to FIGS. 3A to 3O.

Figure 3A:
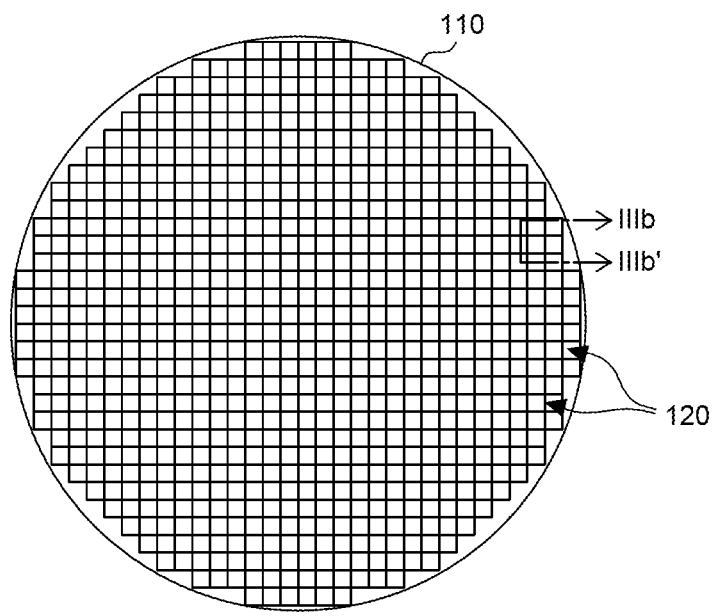
FIGS. 3A to 3O are schematic views for illustrating processing steps of a method of fabricating a display device according to an exemplary embodiment of the present disclosure.
Figure 3B:
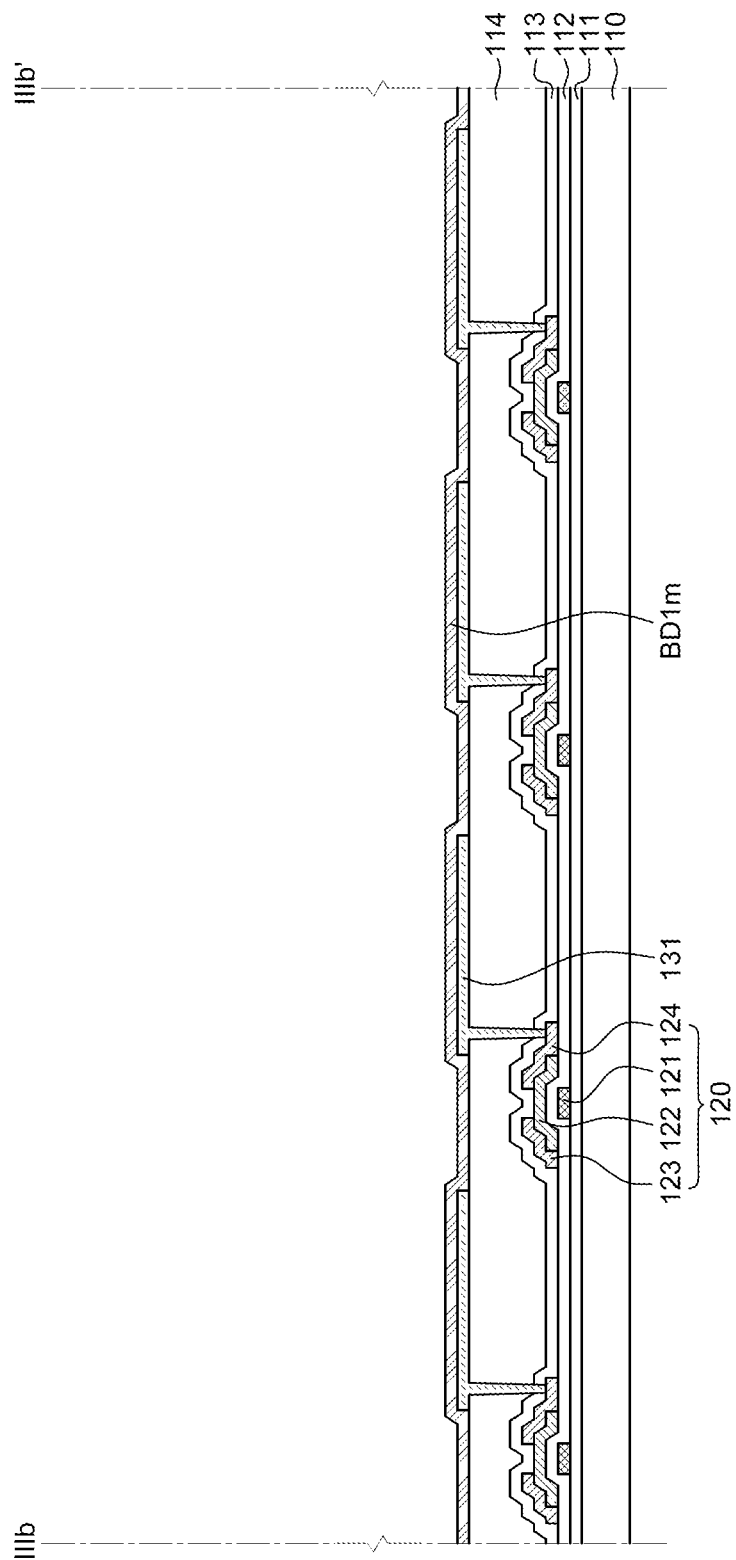
Figure 3C:
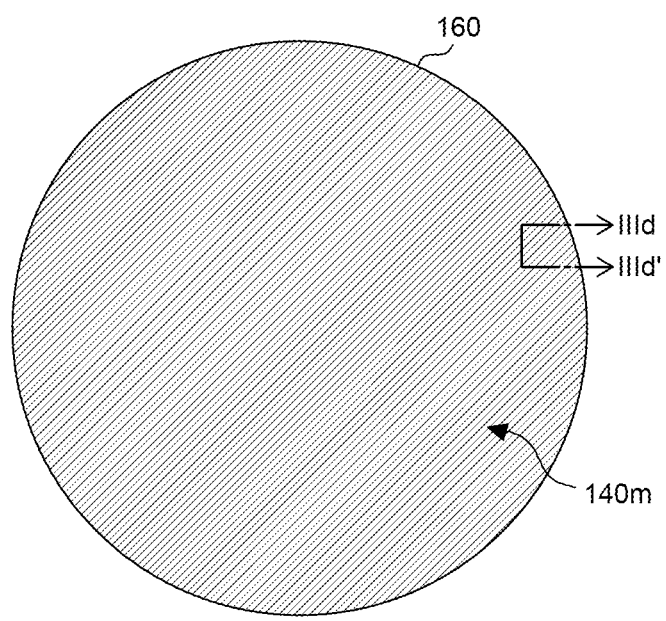
Figure 3D:
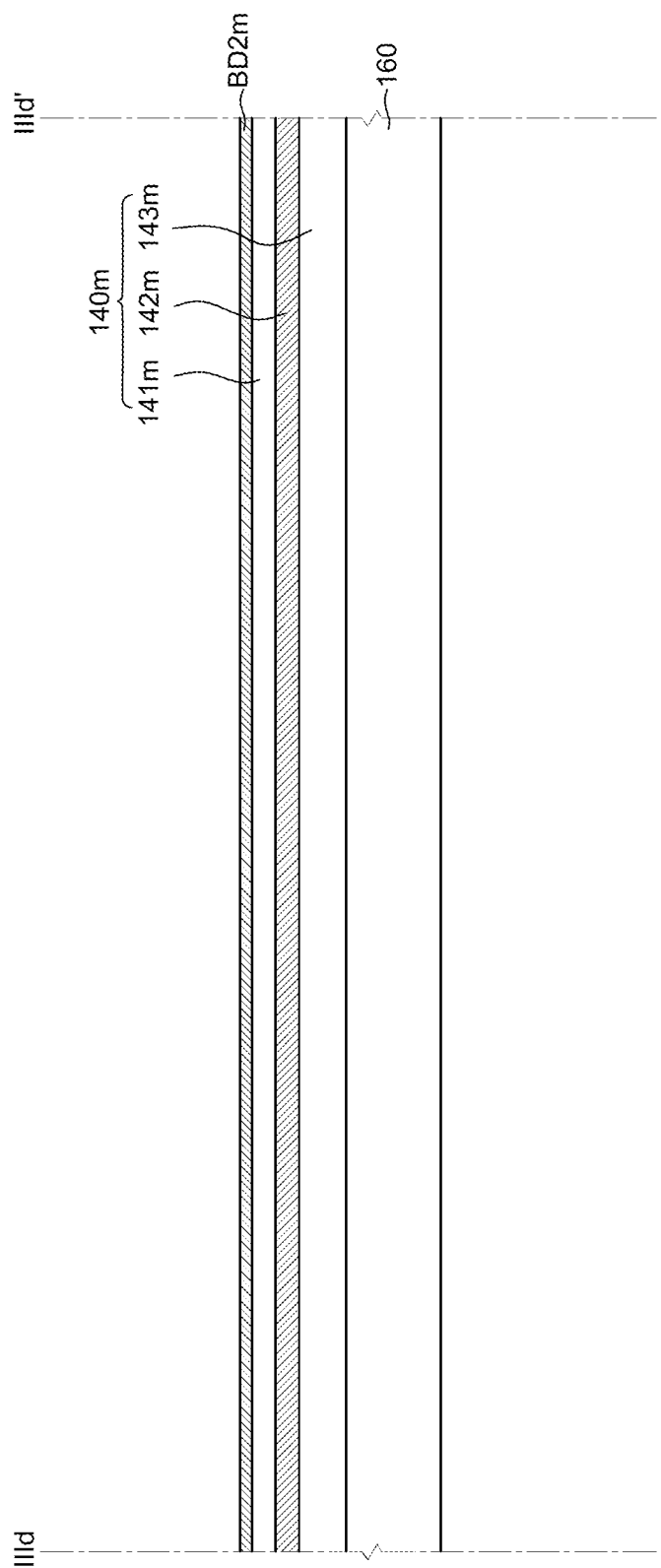
Figure 3E:
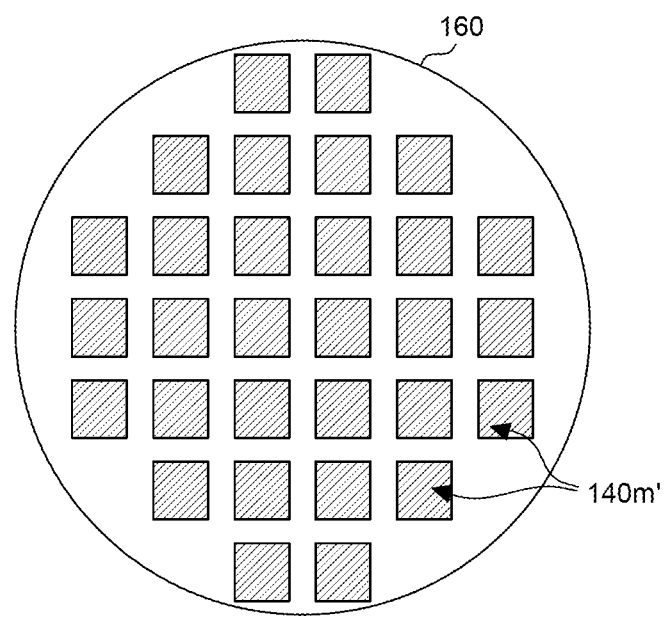
Figure 3F:
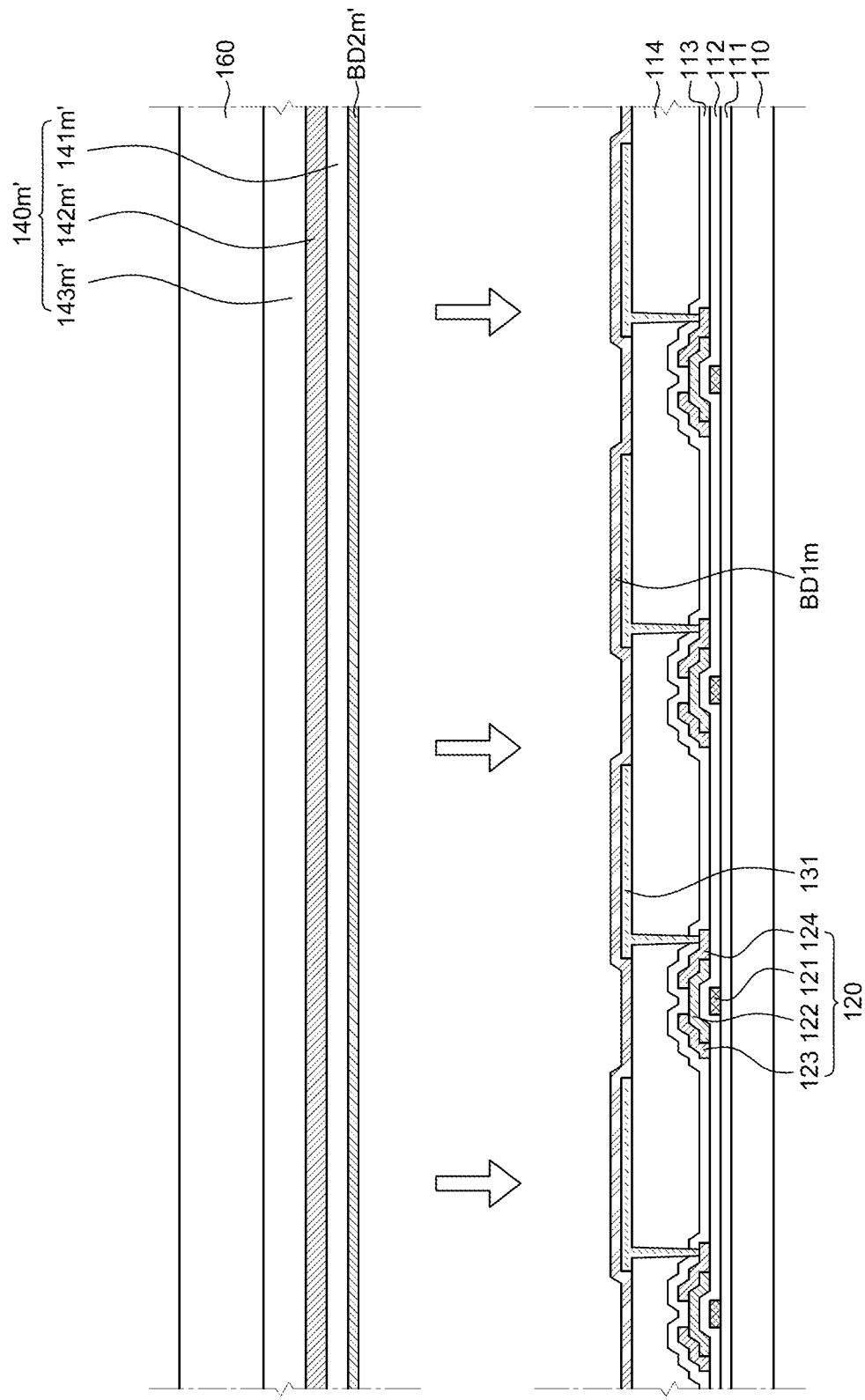
Figure 3G:
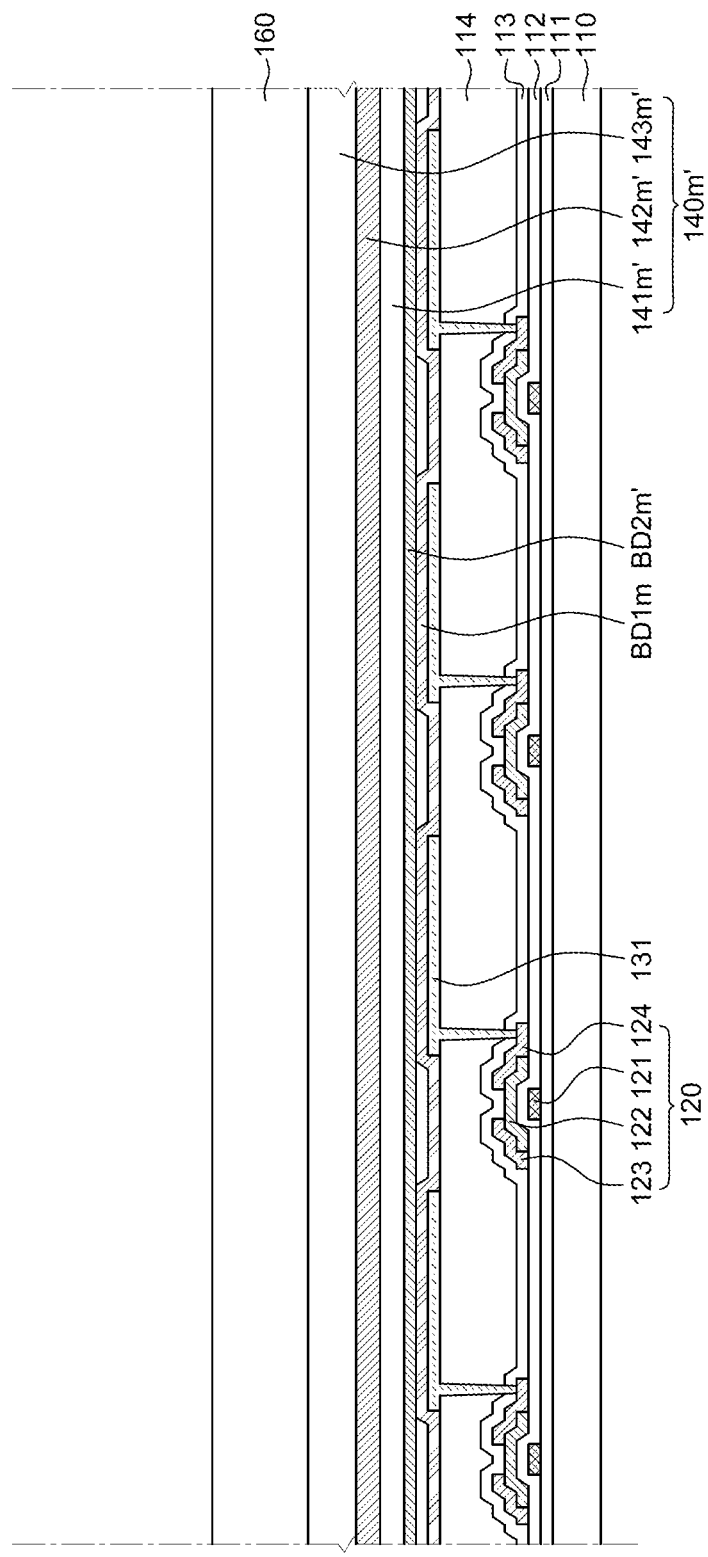
Figure 3H:
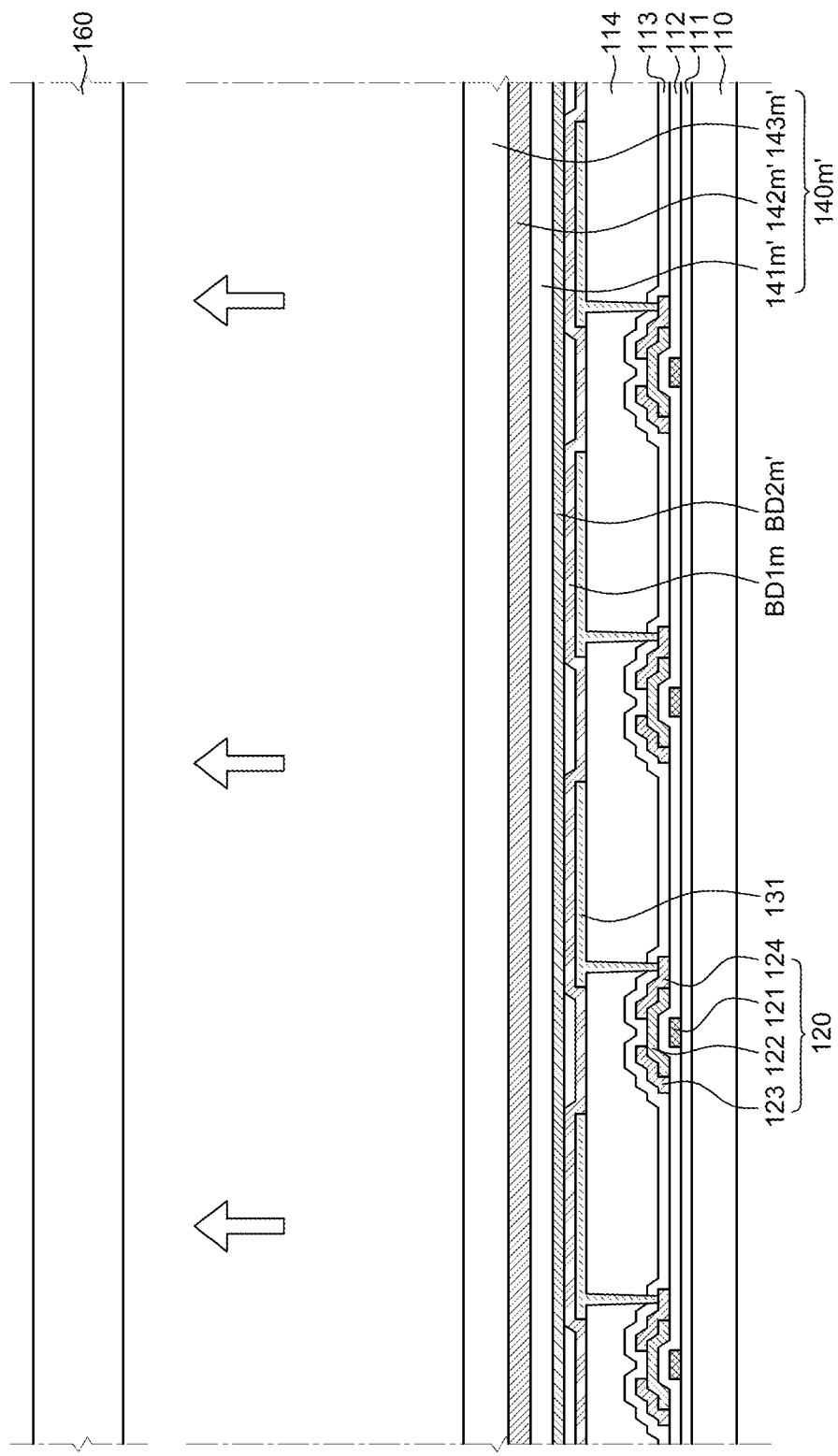
Figure 3I:
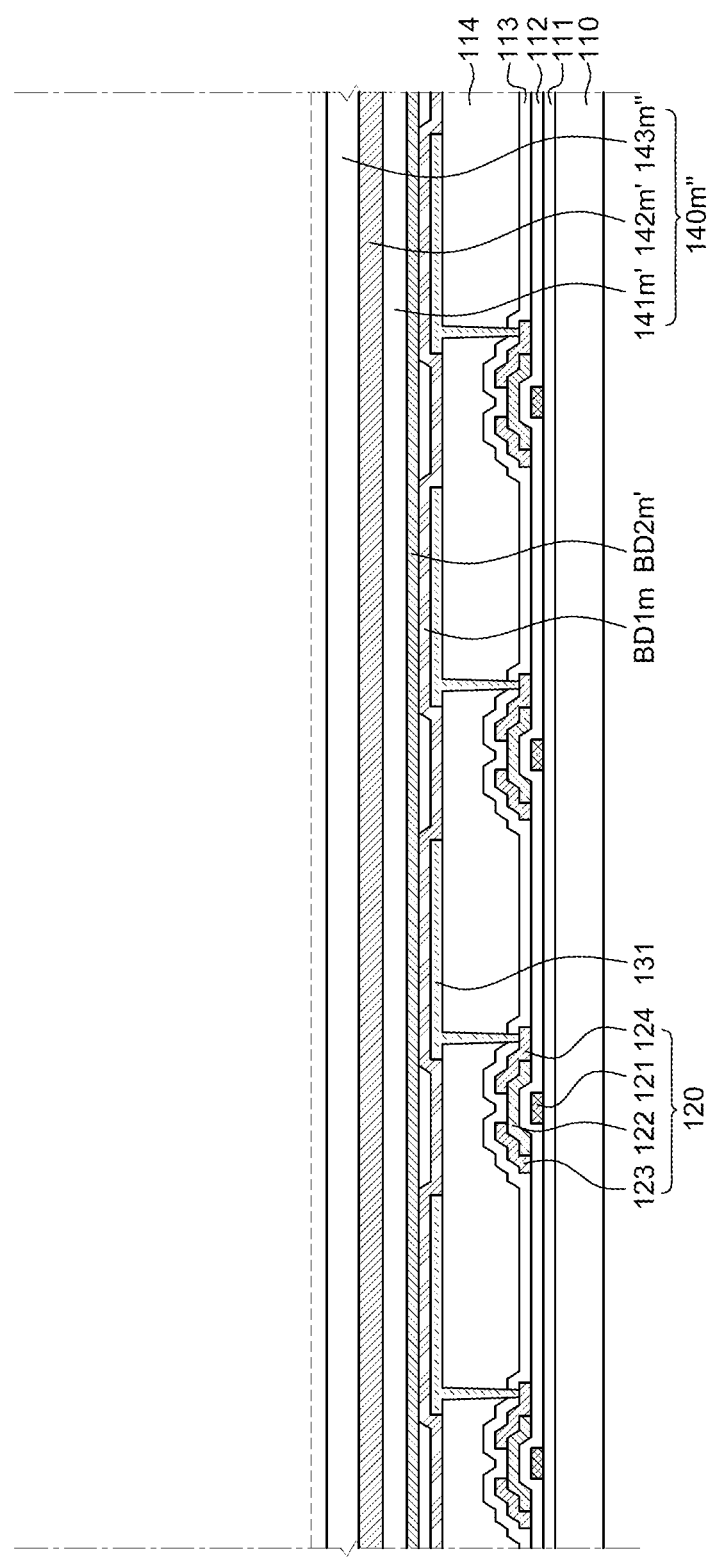
Figure 3J:
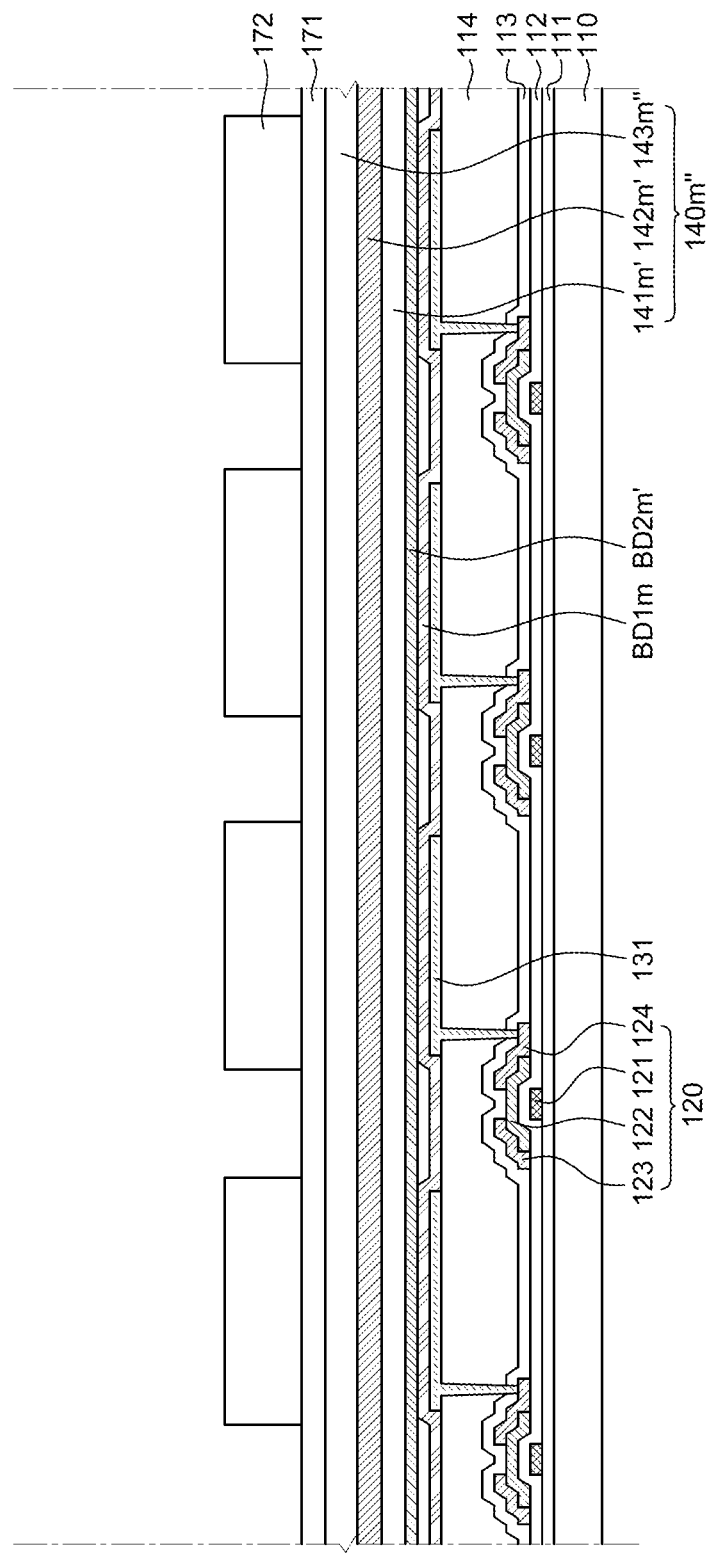
Figure 3K:
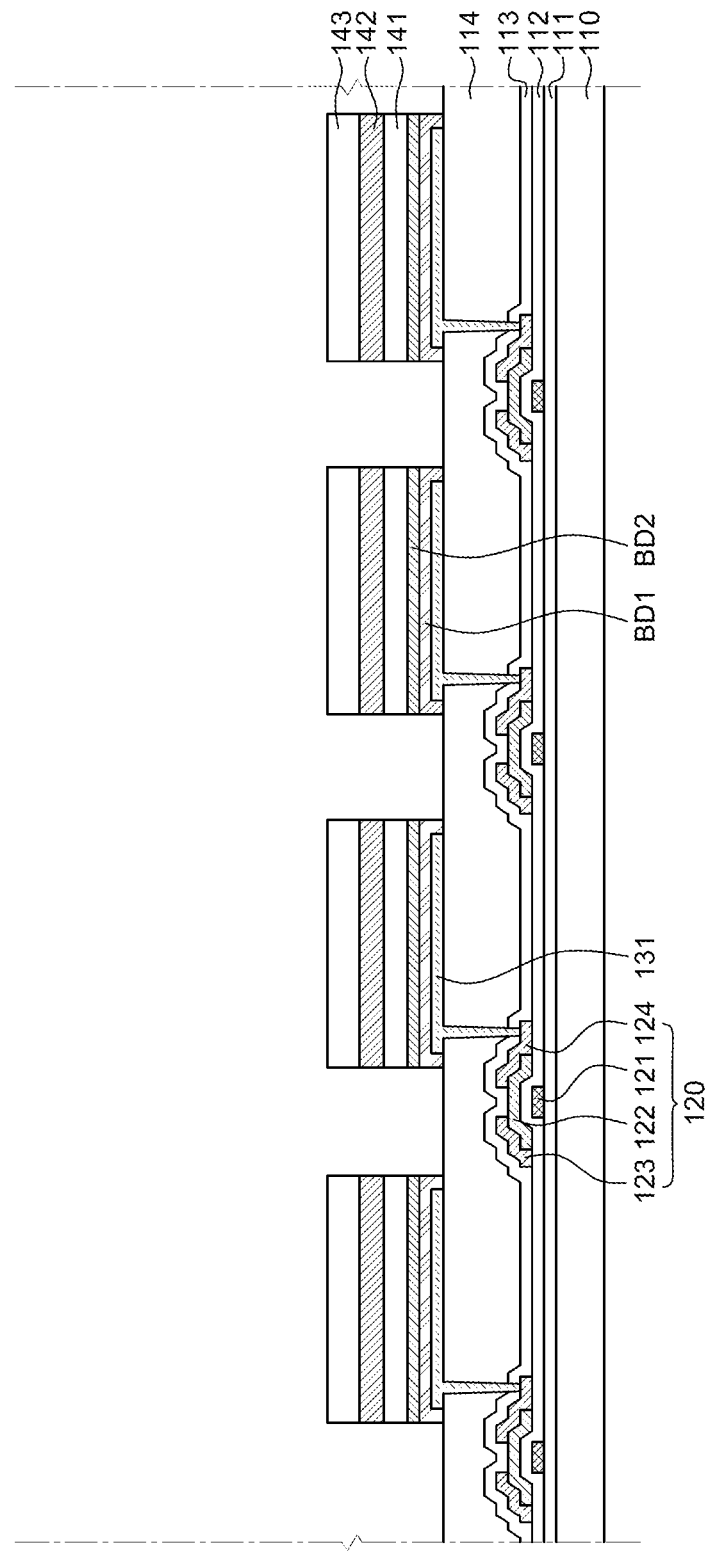
Figure 3L:
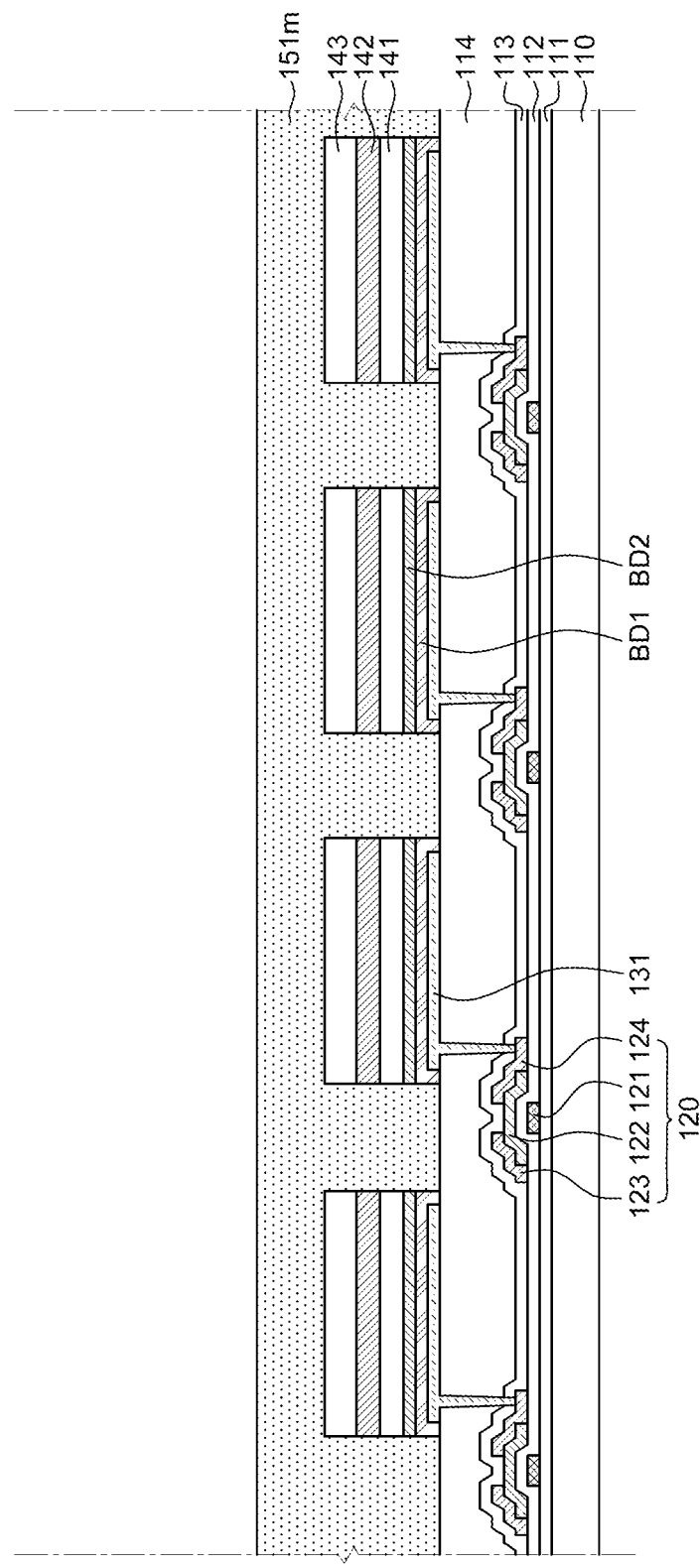
Figure 3M:
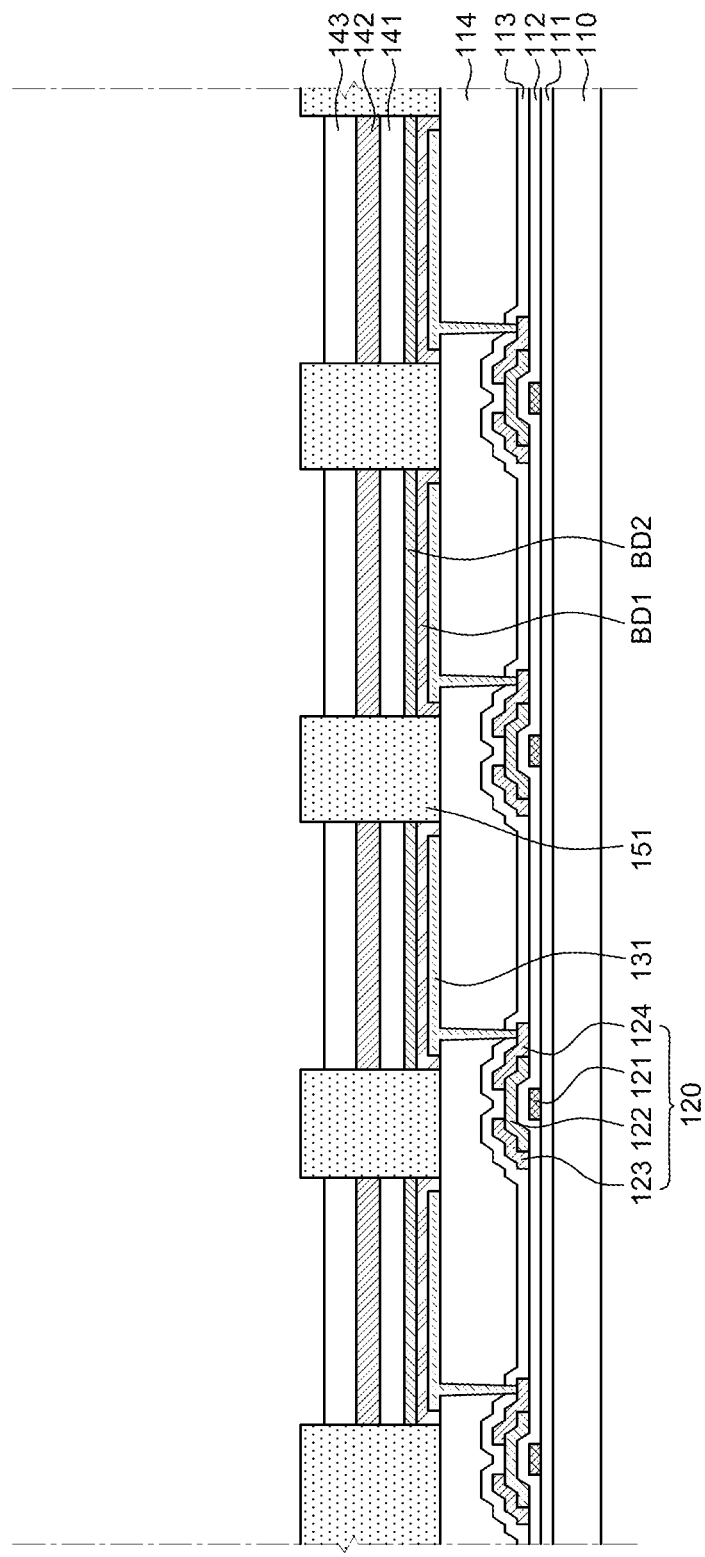
Figure 3N:
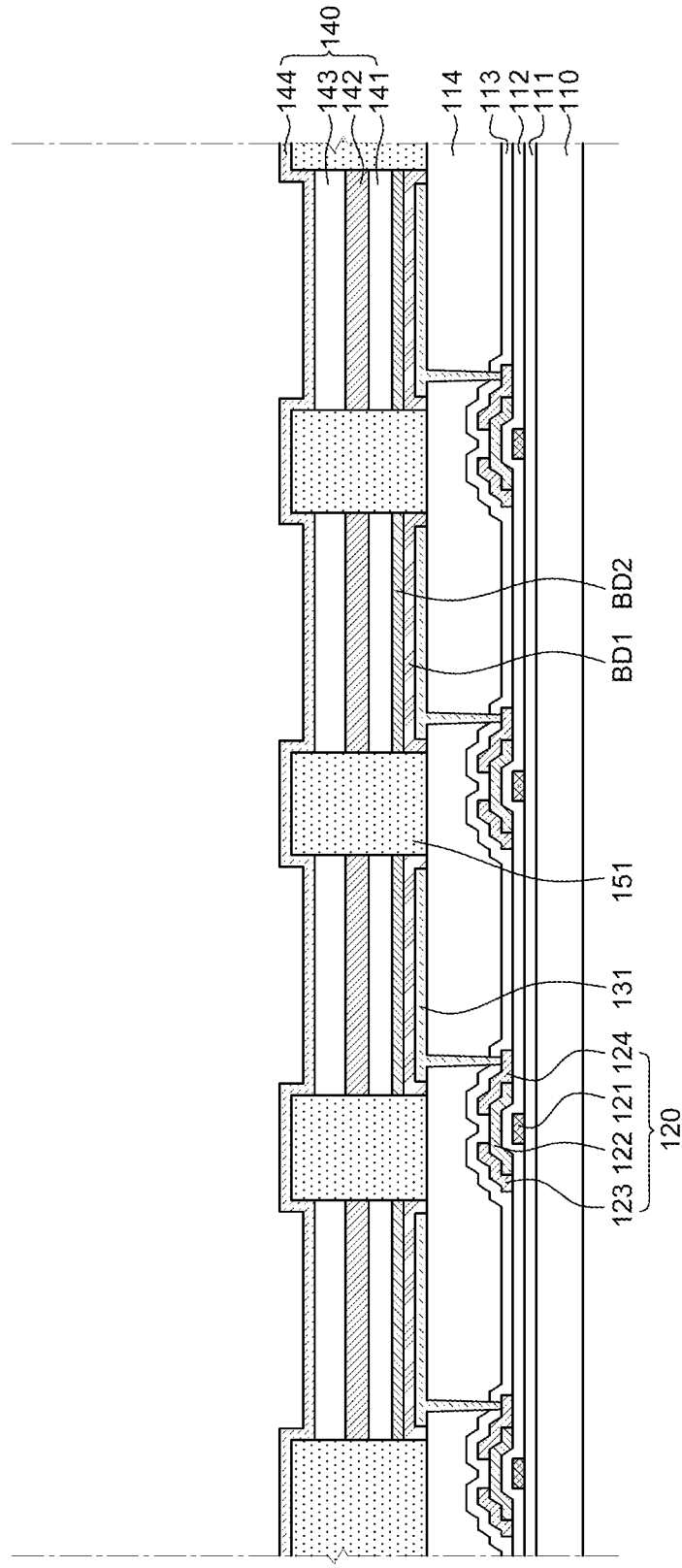
Figure 3O:
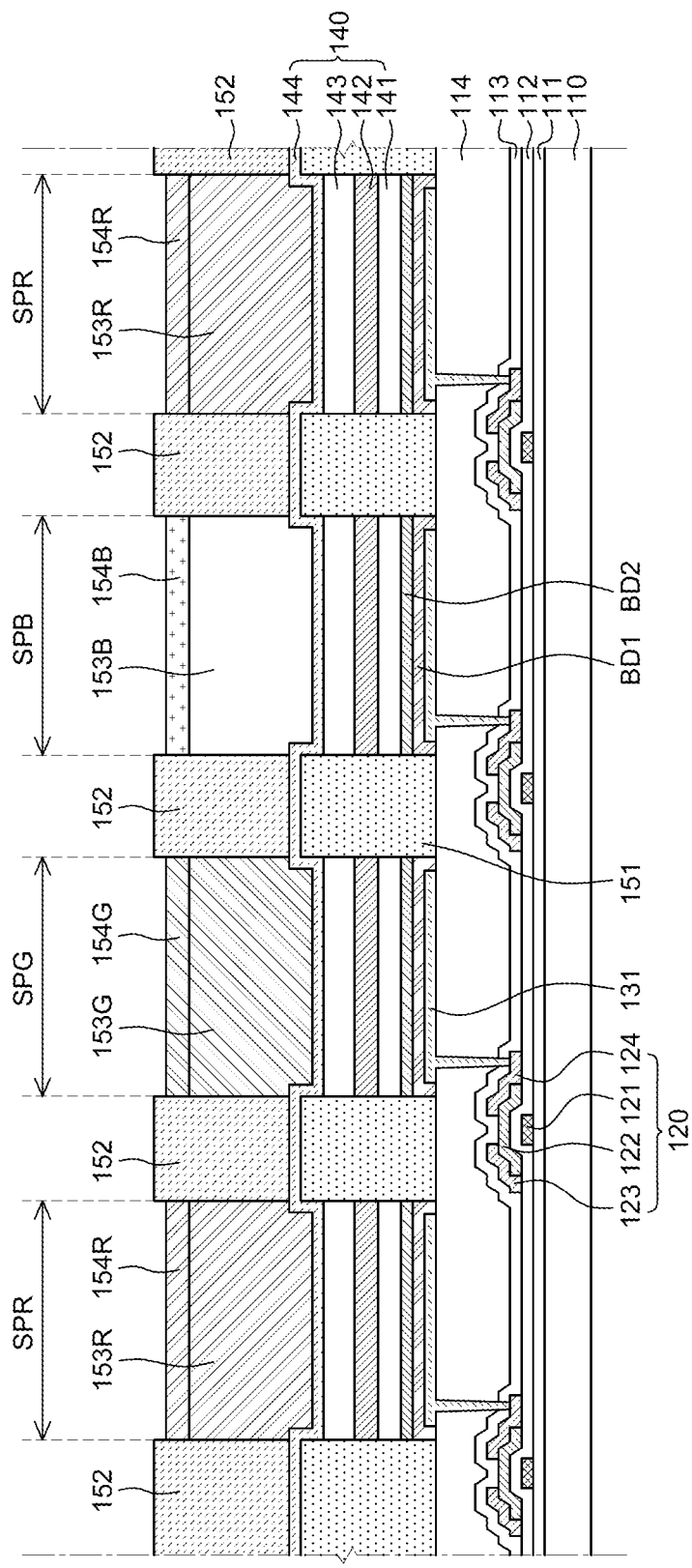

FIGS. 3A to 3O are schematic views for illustrating processing steps of a method of fabricating a display device according to an exemplary embodiment of the present disclosure. Specifically, FIG. 3A is a schematic plan view of a first substrate 110 on which a plurality of semiconductor elements 120 is formed. FIG. 3B is a cross-sectional view taken along line IIIb-IIIb' in FIG. 3A. FIG. 3C is a schematic plan view of a second substrate 160 on which an epitaxial layer 140m is formed. FIG. 3D is a cross-sectional view taken along line IIId-IIId' of FIG. 3C. FIG. 3E is a schematic plan view of the second substrate 160 on which epitaxial layers 140m' are formed. FIGS. 3F and 3G are schematic cross-sectional views illustrating processes of bonding the first substrate 110 and the second substrate 160 together. FIG. 3H is a schematic cross-sectional view for illustrating a process of separating the second substrate 160. FIG. 3I is a schematic cross-sectional view for illustrating the processing of the epitaxial layer 140m". FIGS. 3J and 3K are schematic cross-sectional views for illustrating a process of forming a plurality of LEDs 140 from the epitaxial layer 140m". FIGS. 3L and 3M are schematic cross-sectional views for illustrating a process of forming a plurality of reflectors 151. FIG. 3N is a schematic cross-sectional view for illustrating a process of forming a common electrode 144. FIG. 3O is a schematic cross-sectional view illustrating a process of forming a plurality of light-blocking layers 152, a plurality of light conversion layers 153R, 153G and 153B, and a plurality of color filters 154R, 154G and 154B.

Referring to FIGS. 3A and 3B, a plurality of semiconductor elements 120 is formed on a first substrate 110.

Actually, the plurality of semiconductor elements 120 formed on the first substrate 110 cannot be observed by human's eyes because they are very small. However, for convenience of illustration, a lattice pattern is depicted on the first substrate 110 in FIG. 3A as an example, and the size of the lattice pattern is irrelevant to the size of the semiconductor elements 120.

The first substrate 110 is a substrate on which the plurality of semiconductor elements 120 is formed. After the LEDs 140 have been formed on the semiconductor elements 120, the first substrate 110 may be processed into the size of the display device 100, to form the display device 100.

In order to prevent moisture or impurities from diffusing into the semiconductor elements 120, the LEDs 140, etc., from the first substrate 110, a buffer layer 111 is formed to cover the upper surface of the first substrate 110.

Subsequently, gate electrodes 121 of the semiconductor elements 120 are formed on the buffer layer 111.

Specifically, a conductive material may be formed on the buffer layer 111, and the conductive material may be etched to form the gate electrodes 121.

Subsequently, a gate insulating layer 112 for insulating the gate electrodes 121 from active layers 122 is formed on the gate electrodes 121.

Subsequently, the active layers 122 may be formed on the gate insulating layer 112 so that they overlap the gate electrodes 121, respectively, and the source electrodes 123 and the drain electrodes 124 may be formed on the active layers 122.

Specifically, the active layers 122 may be formed by forming a material for forming the active layers 122 on the gate insulating layer 112, and the material may be etched to form the active layers 122. The active layers 122 may overlap the gate electrodes 121, respectively.

Subsequently, the source electrodes 123 and the drain electrodes 124 are formed so that they are in contact with a part of the upper surfaces of the active layers 122.

Specifically, the source electrodes 123 and the drain electrodes 124 may be formed by forming a conductive material on the active layers 122 and etching out the conductive material. In this manner, the semiconductor elements 120 each including the gate electrode 121, the active layer 122, the source electrode 123 and the drain electrode 124 can be formed.

Subsequently, a passivation layer 113 and planarization layer 114 are sequentially formed to cover the semiconductor elements 120. Specifically, a material for forming the passivation layer 113 and a material for forming the planarization layer 114 are sequentially formed on the semiconductor elements 120, and contact holes for exposing the drain electrodes 124 of the semiconductor elements 120 are formed, thereby forming the passivation layer 113 and the planarization layer 114. Accordingly, the passivation layer 113 can protective the semiconductor elements 120, and the planarization layer 114 can provide a flat surface over the semiconductor elements 120.

Subsequently, a plurality of connection electrodes 131 are formed on the planarization layer 114. Specifically, a conductive material may be formed on the planarization layer 114, and the conductive material may be etched to form the connection electrodes 131. Since the contact holes formed in the planarization layer 114 and the passivation layer 113 are filled with the conductive material, the connection electrodes 131 may be electrically connected to the semiconductor elements 120 through the contact holes.

Subsequently, a first metal layer BD1m is formed on the planarization layer 114 and the connection electrodes 131. The first metal layer BD1m is for electrically connecting an epitaxial layer 140m of the second substrate 160 to be described later with the semiconductor elements 120 and may be electrically connected to a second metal layer BD2m of the second substrate 160 by eutectic bonding. The eutectic bonding of the first metal layer BD1m and the second metal layer BD2m will be described later with reference to FIGS. 3F and 3G.

Referring to FIGS. 3C and 3D, the epitaxial layer 140m is formed throughout the surface of the second substrate 160.

The second substrate 160 is a substrate on which the epitaxial layer 140m is grown. The second substrate 160 may be made of, but is not limited to, sapphire, silicon carbide (SiC), gallium nitride (GaN), zinc oxide (ZnO).

The epitaxial layer 140m is for forming the plurality of LEDs 140 and may have a structure in which a material for forming a first semiconductor layer 141, a material for forming an light-emitting layer 142 and a material for forming a second semiconductor layer 143, which form the LEDs 140, are stacked on one another sequentially. For example, the epitaxial layer 140m may be made of a second semiconductor material layer 143m, a light-emitting material layer 142m, and a first semiconductor material layer 141m. By chopping the epitaxial layer 140m into pieces, a plurality of LEDs 140 can be formed, which will be described later with reference to FIGS. 3J to 3N.

Specifically, the second semiconductor material layer 143m is formed throughout the surface of the second substrate 160. The second semiconductor material layer 143m may be made of gallium nitride doped with, e.g., n-type impurities, as the material for forming the second semiconductor layer 143 of the LEDs 140.

Subsequently, the light-emitting material layer 142m is formed on the second semiconductor material layer 143m. The light-emitting material layer 142m may be made of, e.g., indium gallium nitride, gallium nitride, or the like, as the material for forming the light-emitting layer 142 of the LEDs 140.

Subsequently, the first semiconductor material layer 141m is formed on the light-emitting material layer 142m. The first semiconductor material layer 141m may be made of gallium nitride doped with, e.g., p-type impurities, as the material for forming the first semiconductor layer 141 of the LEDs 140.

Subsequently, the second metal layer BD2m is formed on the first semiconductor material layer 141m. The second metal layer BD2m is for eutectic bonding with the first metal layer BD1m of the first substrate 110. The plurality of semiconductor elements 120 of the first substrate 110 and the epitaxial layer 140m of the second substrate 160 can be bonded together by eutectic bonding the first metal layer BD1m and the second metal layer BD2m together.

Subsequently, referring to FIG. 3E, the second semiconductor material layer 143m, the light-emitting material layer 142m, the first semiconductor material layer 141m and the second metal layer BD2m formed throughout the surface of the second substrate 160 are processed into the size of the display device 100, to form a plurality of epitaxial layers 140m' and a plurality of second metal layers BD2m'. Specifically, the second semiconductor material layer 143m, the light-emitting material layer 142m, the first semiconductor material layer 141m and the second metal layer BD2m formed throughout the surface of the second substrate 160 as a single piece may be pre-processed into the size of the display device 100. The sizes of the epitaxial layers 140m' and the second metal layers BD2m' may be equal to the size of the active area AA or the size of the active area AA and the non-active area NA. It is to be understood that the sizes of the processed epitaxial layers 140m' and the processed second metal layers BD2m' are not particularly limited as long as the sizes are equal to or greater than the size of the active area AA of the display device 100.

After the epitaxial layers 140m' and the second metal layers BD2m' have been processed into the size of the display device 100, they are bonded on the semiconductor elements 120 of the first substrate 110 to form the plurality of LEDs 140. In this manner, the single display device 100 can be produced.

It is also possible that the second semiconductor material layer 143m, the light-emitting material layer 142m, the first semiconductor material layer 141m and the second metal layer BD2m formed throughout the surface of the second substrate 160 are bonded on the semiconductor elements 120 of the first substrate 110, and then they may be processed into the size of the display device 100, to form the LEDs 120 and the second bonding electrodes BD2. That is to say, the second semiconductor material layer 143m, the light-emitting material layer 142m, the first semiconductor material layer 141m and the second metal layer BD2m formed throughout the surface of the second substrate 160 as a single piece may be pre-processed into the size of the display device 100 and then may be bonded on the first substrate 110, or the second semiconductor material layer 143m, the light-emitting material layer 142m, the first semiconductor material layer 141m and the second metal layer BD2m formed throughout the surface of the second substrate 160 as a single piece may be bonded on the first substrate 110 and then may be processed into the size of the display device 100. It is, however, to be understood that the present disclosure is not limited thereto.

Hereinafter, a process of bonding the plurality of semiconductor elements 120 of the first substrate 110 and the plurality of epitaxial layers 140m' of the second substrate 160 will be described with reference to FIGS. 3F and 3G.

Referring to FIGS. 3F and 3G, the first substrate 110 and the second substrate 160 are bonded together. Specifically, the first substrate 110 and the second substrate 160 are bonded together such that the first metal layer BD1m of the first substrate 110 and the plurality of second metal layers BD2m' of the second substrate 160 are in contact with each other. Accordingly, on a first metal layers BD1m of the first substrate 110, a plurality of second metal layers BD2m', a plurality of first semiconductor material layers 141m', a plurality of light-emitting material layers 142m', a plurality of second semiconductor material layer 143m' and the second substrate 160 may be disposed in this order.

The first substrate 110 and the second substrate 160 may be bonded together by eutectic bonding the first metal layer BD1m to the plurality of second metal layers BD2m'. Eutectic bonding is a wafer bonding technique by thermocompression bonding at a high temperature of 200 to 700° C. or more, which is an extremely robust and highly reliable bonding process. The eutectic bonding technique has advantages that it can achieve a high bonding strength and that it requires no an additional adhesive from the outside. Although the first metal layer BD1m and the second metal layers BD2m' are formed on both the first substrate 110 and the second substrate 160 in the example shown in FIG. 3F, the present disclosure is not limited thereto. They may be formed only one of the first substrate 110 and the second substrate 160.

Referring to FIG. 3H, the second substrate 160 is separated from the plurality of epitaxial layers 140m'. Specifically, the second substrate 160 is separated from the plurality of second semiconductor material layers 143m' of the plurality of epitaxial layers 140m'. For example, the second substrate 160 may be separated from the second semiconductor material layers 143m' by using a laser lift-off (LLO) technique.

According to the laser lift-off technique, a laser is irradiated onto the second substrate 160, then the laser is absorbed at the interface between the second semiconductor material layers 143m' and the second substrate 160. As a result, the second substrate 160 can be separated by the thermochemical decomposition reaction of the n-type gallium nitride forming the second semiconductor material layer 143m'. It is to be understood that the second substrate 160 may be separated by using other techniques than the laser lift-off technique.

Referring to FIG. 3I, the second semiconductor material layers 143m' exposed from the second substrate 160 may be processed to form a plurality of processed second semiconductor material layers 143m". For example, as described above with reference to FIGS. 3C and 3D, when the epitaxial layer 140m is grown throughout the surface of the second substrate 160, the thickness of the second semiconductor material layer 143m may be greater than the sum of the thickness of the first semiconductor material layer 141m and the thickness of the light-emitting material layer 142m. The height of the LEDs 140 may be determined from the thickness of the epitaxial layer 140m including the first semiconductor material layer 141m, the light-emitting material layer 142m and the second semiconductor material layer 143m. In this regard, by processing the second semiconductor material layers 143m' exposed from the second substrate 160 to form the plurality of processed second semiconductor material layers 143m", the thickness of the epitaxial layer 140m' can be reduced, and the height of the LEDs 140 can also be reduced.

Incidentally, when the second substrate 160 is separated from the second semiconductor material layers 143m', residues may remain on the surface of the second semiconductor material layers 143m'. By processing the surface of the second semiconductor material layers 143m', it is possible to remove the residues on the surface of the processed second semiconductor material layers 143m", and to make the surface of the processed second semiconductor material layers 143m" flat.

The processed second semiconductor material layers 143m" may be formed by, for example, a chemical mechanical planarization (CMP) technique.

It is to be noted that a process of reducing the thickness of the plurality of second semiconductor material layers 143m' depending on the thickness of the second semiconductor material layer 143m grown on the second substrate 160.

Referring to FIG. 3J, a protective layer 171 and a photoresist pattern 172 are sequentially formed on the processed second semiconductor material layers 143m".

The protective layer 171 is formed throughout the surface of the processed second semiconductor material layers 143m". When the processed second semiconductor material layers 143m", the light-emitting material layers 142m' and the first semiconductor material layers 141m' have very small thicknesses, they may be overly etched and may be damaged. By forming the protective layer 171 on the processed second semiconductor material layers 143m", it is possible to protect the processed second semiconductor material layers 143m", the light-emitting material layers 142m' and the first semiconductor material layers 141m' from being damaged as they are overly etched. It is to be noted that the protective layer 171 is an optional element that may be disposed depending on the thickness of the epitaxial layers 140m". For example, the protective layer 171 may not be disposed if the epitaxial layers 140m" have a sufficient thickness. The protective layer 171 may be made up of, but is not limited to, a single layer of silicon oxide (SiOx) or silicon nitride (SiNx) or multiple layers thereof.

The photoresist pattern 172 may be formed by applying a photoresist on the protective layer 171, and then exposing and developing it via a photolithography process using a mask. The photoresist pattern 172 may be formed so that it is in line with positions where the LEDs 120 formed from the epitaxial layers 140m" are located. For example, the photoresist pattern 172 may be formed so that it overlaps the connection electrodes 131.

Subsequently, the plurality of epitaxial layers 140m", the plurality of second metal layers BD2m' and the first metal layer BD1m are etched to form a plurality of first semiconductor layers 141, a plurality of light-emitting layers 142, and a plurality of second semiconductor layer 143, a second bonding electrode BD2 and a first bonding electrode BD1.

Referring to FIG. 3K, parts of the processed second semiconductor material layers 143m", the light-emitting material layers 142m', the first semiconductor material layers 141m', the second metal layers BD2m' and the first metal layer BD1m that do not overlap with the photoresist pattern 172 are etched, leaving the other parts of the processed second semiconductor material layers 143m", the light-emitting material layers 142m', the first semiconductor material layers 141m', the second metal layers BD2m' and the first metal layer BD1m that overlap with the photoresist pattern 172. As a result, a plurality of first semiconductor layers 141, a plurality of light-emitting layers 142, a plurality of second semiconductor layers 143, second bonding electrodes BD2, and first bonding electrodes BD1 can be formed.

As described above with reference to FIG. 3J, as the photoresist pattern 172 overlaps with the connection electrodes 131, the first semiconductor layers 141, the light-emitting layers 142, the second semiconductor layers 143, the second bonding electrodes BD2 and the first bonding electrodes BD1 may be formed on the regions that overlap with the connection electrodes 131. The first semiconductor layers 141, the light-emitting layers 142 and the second semiconductor layers 143 formed from the epitaxial layers 140m" may form the LEDs 140.

Subsequently, a plurality of reflectors 151 is formed between the first semiconductor layers 141, the light-emitting layers 142 and the second semiconductor layers 143.

Referring to FIGS. 3L and 3M, a reflective layer 151m is formed to cover the side portions of the second semiconductor layers 143, the side portions of the light-emitting layers 142, the side portions of the first semiconductor layers 141, and the upper surfaces of the second semiconductor layers 143. Specifically, the space between the second semiconductor layers 143, between the light-emitting layers 142, between the first semiconductor layers 141, between the second bonding electrodes BD2 and between the first bonding electrodes BD1 may be filled with the reflective layer 151. The reflective layer 151m between the second semiconductor layers 143, between the light-emitting layers 142, between the first semiconductor layers 141, between the second bonding electrodes BD2 and between the first bonding electrodes BD1 may be in contact with the side portions of the second semiconductor layers 143, the side portions of the light-emitting layers 142, the side portions of the first semiconductor layers 141, the side portions of the second bonding electrodes BD2 and the side portions of the first bonding electrodes BD1.

The reflective layer 151m may be formed by alternately stacking different kinds of dielectrics. The reflective layer 151m, on which different kinds of dielectrics are stacked, can reflect light.

Referring to FIG. 3N, the upper surfaces of the second semiconductor layers 143 covered with the reflective layer 151m are opened from the reflective layer 151m. Specifically, parts of the reflective layer 151m overlapping the upper surfaces of the second semiconductor layers 143 are etched, to form a plurality of reflectors 151 between the first semiconductor layers 141, between the light-emitting layers 142 and between the second semiconductor layers 143. Although the height of the reflectors 151 may be larger than the upper surfaces of the second semiconductor layers 143 as shown in FIG. 3N, the present disclosure is not limited thereto. The height of the reflectors 151 may be equal to or lower than the upper surfaces of the second semiconductor layers 143.

Subsequently, a common electrode 144 is formed on the reflectors 151 and the second semiconductor layers 143.

Referring to FIG. 3O, the common electrode 144 may be formed to cover the upper surfaces of the reflectors 151 and the upper surfaces of the second semiconductor layers 143. Once the common electrode 144 is formed, the LEDs 140 can be completed.

The common electrode 144 may be formed across a plurality of sub-pixels SP as a single piece. In other words, the plurality of LEDs 140 may share the common electrode 144. Although not shown in the drawings, the common electrode 144 may be extended to the non-active area NA to be applied with a voltage from a driver IC or the like disposed in the non-active area NA.

Subsequently, a plurality of light-blocking layers 152, a plurality of light conversion layers 153R, 153G and 153B, and a plurality of color filters 154R, 154G and 154B are formed on the common electrode 144.

Referring to FIG. 3O, the plurality of light-blocking layers 152 may be formed on the common electrode 144 such that they overlap the reflectors 151, respectively. The light-blocking layers 152 may be formed on the common electrode 144 at the boundaries between the sub-pixels SP. Specifically, a material for forming the light-blocking layer 152 is formed on the common electrode 144, and parts of the material that overlap with the LEDs 140 are etched, to form the light-blocking layers 152.

Subsequently, the light conversion layers 153R, 153G and 153B may be formed on the common electrode 144 such that they overlap the first semiconductor layers 141, the light-emitting layers 142 and the second semiconductor layers 143, respectively. The light conversion layers 153R, 153G and 153B may be formed on the common electrode 144 in a plurality of sub-pixels SP, respectively. Specifically, a red light conversion layer 153R may be formed in a red sub-pixel SPR among the plurality of sub-pixels SP. A green light conversion layer 153G may be formed in a green sub-pixel SPG among the plurality of sub-pixels SP. A blue light conversion layer 153B may be formed in a blue sub-pixel SPB among the plurality of sub-pixels SP.

Subsequently, the plurality of color filters 154R, 154G and 154B may be formed on the plurality of light conversion layers 153R, 153G, and 153B, respectively. The plurality of color filters 154R, 154G and 154B may be formed on the plurality of light conversion layers 153R, 153G, and 153B in the sub-pixels SP, respectively. Specifically, a red color filter 154R may be formed on the red light conversion layer 153R in the red sub-pixel SPR among the plurality of sub-pixels SP. A green color filter 154G may be formed on the green light conversion layer 153G in the green sub-pixel SPG among the plurality of sub-pixels SP. A blue color filter 154B may be formed on the blue light conversion layer 153B in the blue sub-pixel SPB among the plurality of sub-pixels SP.

In the display device 100 and a method of fabricating the display device 100 according to the exemplary embodiment of the present disclosure, the LEDs 140 are formed on the semiconductor elements 120, such that it is possible to avoid misalignment between the semiconductor elements 120 and the LEDs 140. The first substrate 110 on which the semiconductor elements 120 are formed and the second substrate 160 on which the epitaxial layer 140$m$ of the LEDs 140 is formed may be made of different materials. For example, the first substrate 110 may be made of silicon to facilitate the formation of the semiconductor elements 120, and the second substrate 160 may be made of sapphire to facilitate the formation of the LEDs 140.

Previously, a plurality of semiconductor elements is formed on a first substrate, an epitaxial layer is grown on a second substrate, and a plurality of LEDs is formed from the epitaxial layer. Then, the semiconductor elements of the first substrate and the LEDs of the second substrate are bonded together, to form a display device. The thermal expansion coefficient of the first substrate made of silicon is approximately 3.6 ppm/° C., and the thermal expansion coefficient of the second substrate made of sapphire is approximately 7.8 ppm/° C. Accordingly, the thermal expansion coefficient of the first substrate is different from that of the second substrate. Due to such a difference in thermal expansion coefficient between the first substrate and the second substrate, the semiconductor elements of the first substrate and the LEDs of the second substrate may be dislocated from the designed locations when they are bonded together.

In view of the above, in the display device 100 and the method of fabricating the display device 100 according to the exemplary embodiment of the present disclosure, the LEDs 140 are formed directly on the semiconductor elements 120 of the first substrate 110, so that it is possible to avoid misalignment caused by the difference in thermal expansion coefficient between the first substrate 110 and the second substrate 160. Specifically, epitaxial layers 140$m'$ of the second substrate 160 before being processed into the LEDs 140 are bonded on the semiconductor elements 120. Subsequently, the second substrate 160 is separated from the epitaxial layers 140$m'$, the epitaxial layer 140$m''$ bonded on the semiconductor elements 120 is etched, and the common electrode 144 is formed thereon, so that the LEDs 140 can be formed. Accordingly, in the display device 100 and the method of fabricating the display device 100 according to the exemplary embodiment of the present disclosure, the epitaxial layers 140$m'$ is bonded to the semiconductor elements 120 before the LEDs 140 are formed thereon, it is possible to avoid the misalignment between the first substrate 110 and the second substrate 160 due to a difference in thermal expansion coefficient.

In addition, in the display device 100 and a method of fabricating the display device 100 according to the exemplary embodiment of the present disclosure, the LEDs 140 are formed directly on the semiconductor elements 120, such that the transfer process of bonding the LEDs 140 onto the semiconductor elements 120 can be simplified.

Previously, LEDs formed on the second substrate are aligned and bonded to semiconductor elements one by one. As a result, the number of processes and the process time are increased in order to individually transfer the LEDs.

In contrast, in the display device 100 and a method of fabricating the display device 100 according to the exemplary embodiment of the present disclosure, the LEDs 140 are formed directly on the semiconductor elements 120, instead of individually transferring each of the LEDs 140 to the respective of semiconductor elements 120, and thus the transfer process can be omitted to thereby reduce the process time. Subsequently, the epitaxial layer 140$m'$ forming the LEDs 140 are bonded on the semiconductor elements 120, and the epitaxial layers 140$m''$ are etched. After the epitaxial layers 140$m''$ are etched, the common electrode 140 are formed on the second semiconductor layers 143, such that the LEDs 140 may be formed. Accordingly, the entirety of the epitaxial layer 140$m'$ is bonded on the semiconductor elements 120 and is then etched, instead of bonding the LEDs 140 directly on the semiconductor elements 120, such that the LEDs 140 can be aligned with and electrically connected to the semiconductor elements 120. In this manner, it is possible to reduce the processes and time for transferring the LEDs 140.

Lastly, in the display device 100 and the method of fabricating the display device 100 according to the exemplary embodiment of the present disclosure, it is possible to implement the LEDs 140 in an ultra-small size. In order to bond a plurality of LEDs in an ultra-small size to a plurality of semiconductor elements 120, respectively, a very precise technique is required to align the LEDs with the semiconductor elements 120. As there is a precision limit for the alignment technique, there is a limit in reducing the size of the LEDs 140. In contrast, in the display device 100 and a method of fabricating the display device 100 according to the exemplary embodiment of the present disclosure, the LEDs 140 are formed directly on the semiconductor elements 120, and thus the LEDs 140 and the semiconductor elements 120 can be aligned and bonded together, free from the limitation of the size of the LEDs 140. The above can be summarized as follows: misalignment may occur when LEDs 140 in an ultra-small size are aligned with semiconductor elements 120 one by one and then are bonded together. In contrast, when a plurality of epitaxial layers 140$m'$ is bonded to a plurality of semiconductor elements 120 and then a plurality of LEDs 140 is formed, it is possible to avoid misalignment between the semiconductor elements 120 and the LEDs 140, without being limited by the sizes of the LEDs 140. By implementing the plurality of LEDs 140 in an ultra-small size, the size of a single sub-pixel SP can be reduced as well. Therefore, a larger number of sub-pixels SP can be implemented in the display device 100 having the same area. Accordingly, in the display device 100 and the method of fabricating the display device 100 according to the exemplary embodiment of the present disclosure, the LEDs 140 in an ultra-small size can be implemented, and a high-resolution display device 100 may be implemented to display high-resolution images.

The exemplary embodiments of the present disclosure can also be described as follows:

According to an aspect of the present disclosure, there is provided a display device. The display device includes a plurality of semiconductor elements disposed on a substrate, a plurality of LEDs disposed on the plurality of semiconductor elements and electrically connected to the plurality of semiconductor elements, respectively, and a plurality of reflectors disposed above the plurality of semiconductor elements and each located between every two of the LEDs. The plurality of LEDs comprise a plurality of light-emitting layers disposed on the plurality of semiconductor elements, and a common electrode disposed on the plurality of light-emitting layers.

The plurality of light-emitting layers may be formed by patterning an epitaxial layer on the plurality of semiconductor elements.

The plurality of LEDs may further include a plurality of first semiconductor layers disposed between the plurality of semiconductor elements and the plurality of light-emitting layers, and a plurality of second semiconductor layers disposed on the plurality of light-emitting layers.

The common electrode may be in contact with the plurality of second semiconductor layers and the plurality of reflectors.

The display device may further include a plurality of light conversion layers disposed on an upper surface of the common electrode so that they overlap the plurality of light-emitting layers, respectively, and a plurality of light-blocking layers disposed on the upper surface of the common electrode between every two of the light conversion layers. The plurality of light conversion layers may convert light of a single color emitted from the plurality of LEDs into light of one or more different colors.

The display device may further include a plurality of color filters disposed on the plurality of light conversion layers, respectively.

The display device may further include a planarization layer covering the plurality of semiconductor elements, a plurality of connection electrodes disposed on the planarization layer and electrically connected to the plurality of semiconductor elements, respectively, and one or more bonding electrodes disposed between the plurality of connection electrodes and the plurality of first semiconductor layers.

According to another aspect of the present disclosure, there is provided a method of fabricating a display device. The method of fabricating a display device includes forming a plurality of semiconductor elements on a first substrate, forming an epitaxial layer on a second substrate, bonding the first substrate and the second substrate together such that the plurality of semiconductor elements of the first substrate face the epitaxial layer of the second substrate, separating the second substrate from the epitaxial layer, etching parts of the epitaxial layer to form a plurality of second semiconductor layers, a plurality of light-emitting layers under the second semiconductor layers, and a plurality of first semiconductor layers under the light-emitting layers, forming a plurality of reflectors between the plurality of light-emitting layers and forming a common electrode so that it covers the second semiconductor layers and the reflectors. The second semiconductor layers, the light-emitting layers, the first semiconductor layers and the common electrode form a plurality of LEDs, respectively.

The forming the plurality of semiconductor elements on the first substrate may comprise forming a first metal layer on the semiconductor elements. The forming the epitaxial layer on the second substrate may comprise forming a second semiconductor material layer on the second substrate, forming a light-emitting material layer on the second semiconductor material layer, forming a first semiconductor material layer on the light-emitting material layer, and forming a second metal layer on the first semiconductor material layer. The bonding the first substrate and the second substrate together may comprise electrically connecting the first metal layer of the first substrate with the second metal layer of the second substrate.

The separating the second substrate from the epitaxial layer may further include processing a surface of the second semiconductor material layer that is exposed after the second substrate is separated. A thickness of the second semiconductor material layer after separating the second substrate may be smaller than a thickness of the second semiconductor material layer before separating the second substrate.

The etching parts of the epitaxial layer may include forming a protective layer and a photoresist sequentially on the second semiconductor material layer, etching parts of the second semiconductor material layer, the light-emitting material layer, the first semiconductor material layer and the second metal layer that do not overlap with the photoresist, to form the second semiconductor layer, the light-emitting layers and the first semiconductor layers, etching parts of the first metal layer that do not overlap with the photoresist to form a first bonding electrode and removing the protective layer and the photoresist on the second semiconductor layers.

The forming the plurality of semiconductor elements on the first substrate may include forming a planarization layer to provide a flat surface over the plurality of semiconductor elements, and forming a plurality of connection electrodes on an upper surface of the planarization layer, the plurality of connection electrodes being electrically connected to the plurality of semiconductor elements. The first metal layer may be formed on the planarization layer and the plurality of connection electrodes.

The etching parts of the epitaxial layer may include etching parts of the epitaxial layer that do not overlap with the plurality of connection electrodes.

The forming the plurality of reflectors may include forming a reflective layer so that it covers side portions of the plurality of second semiconductor layers, the plurality of light-emitting layers and the plurality of first semiconductor layers, and an upper surface of the plurality of second semiconductor layers, and etching parts of the reflective layer so that upper surfaces of the plurality of second semiconductor layers are open, to form the plurality of reflectors. The forming the common electrode may include forming the common electrode so that it covers the upper surfaces of the plurality of second semiconductor layers and upper surfaces of the plurality of reflectors.

The method may further include forming a plurality of light-blocking layers on the common electrode such that they overlap the reflectors, respectively, and forming a plurality of light conversion layers on the common electrode such that they overlap the LEDs, respectively. Each of the plurality of light conversion layers may be disposed between every two of the light-blocking layers.

The method may further include forming a plurality of color filters on the light conversion layers, respectively.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a plurality of semiconductor elements disposed on a substrate;
   a plurality of light-emitting diodes (LEDs) on the plurality of semiconductor elements and electrically connected to the plurality of semiconductor elements, respectively; and
   a plurality of reflectors above the plurality of semiconductor elements, each of the plurality of reflectors located between two adjacent ones of the plurality of LEDs,
   wherein the plurality of LEDs includes:
     respective light-emitting layers on the plurality of semiconductor elements;
     a common electrode on the respective light-emitting layers;
     a plurality of first semiconductor layers between the plurality of semiconductor elements and the respective light-emitting layers; and
     a plurality of second semiconductor layers on the respective light-emitting layers.

2. The display device of claim 1, wherein the each of the respective light-emitting layers includes an epitaxial layer on the plurality of semiconductor elements.

3. The display device of claim 1, wherein an upper surface of each of the plurality of reflectors is disposed at a same height with an upper surface of the second semiconductor layers.

4. The display device of claim 1, wherein an upper surface of each of the plurality of reflectors is disposed at a higher height than an upper surface of the second semiconductor layers.

5. The display device of claim 1, wherein the common electrode is in contact with the plurality of second semiconductor layers and the plurality of reflectors.

6. The display device of claim 1, further comprising:
   a planarization layer covering the plurality of semiconductor elements;
   a plurality of connection electrodes on the planarization layer and electrically connected to the plurality of semiconductor elements, respectively; and
   one or more bonding electrodes between the plurality of connection electrodes and the plurality of first semiconductor layers.

7. A display device, comprising:
   a plurality of semiconductor elements disposed on a substrate;
   a plurality of light-emitting diodes (LEDs) on the plurality of semiconductor elements and electrically connected to the plurality of semiconductor elements, respectively, the plurality of LEDs including respective light-emitting layers on the plurality of semiconductor elements, and a common electrode on the respective light-emitting layers; and
   a plurality of reflectors above the plurality of semiconductor elements, each of the plurality of reflectors located between two adjacent ones of the plurality of LEDs, the display device of claim 1, further comprising:
   a plurality of light conversion layers on an upper surface of the common electrode overlapping the light-emitting layers, respectively; and
   a plurality of light-blocking layers on the upper surface of the common electrode between two adjacent ones of the plurality of light conversion layers, the plurality of light conversion layers configured to convert light of a single color emitted from the plurality of LEDs into light of one or more different colors.

8. The display device of claim 7, wherein the plurality of light-blocking layers overlap the plurality of the reflectors.

9. The display device of claim 7, further comprising:
   a plurality of color filters on the plurality of light conversion layers, respectively.

10. The display device of claim 9, wherein one of the plurality of color filters and one of the light conversion layers overlapping each other have a same color.

11. The display device of claim 7, wherein the plurality of LEDs includes:
    a plurality of first semiconductor layers between the plurality of semiconductor elements and the respective light-emitting layers; and
    a plurality of second semiconductor layers on the respective light-emitting layers.

12. The display device of claim 11, wherein an upper surface of each of the plurality of reflectors is disposed at a same height with an upper surface of the second semiconductor layers.

13. The display device of claim 11, wherein an upper surface of each of the plurality of reflectors is disposed at a higher height than an upper surface of the second semiconductor layers.

14. A display device, comprising:
    a plurality of semiconductor elements disposed on a substrate;
    a plurality of light-emitting diodes (LEDs) on the plurality of semiconductor elements and electrically connected to the plurality of semiconductor elements, respectively, the plurality of LEDs including respective light-emitting layers on the plurality of semiconductor elements, and a common electrode on the respective light-emitting layers; and
    a plurality of reflectors above the plurality of semiconductor elements, each of the plurality of reflectors located between two adjacent ones of the plurality of LEDs, wherein the plurality of the reflectors includes a first dielectric material and a second dielectric material that are alternately stacked on each other.

15. The display device of claim 14, wherein the plurality of LEDs includes:
    a plurality of first semiconductor layers between the plurality of semiconductor elements and the respective light-emitting layers; and
    a plurality of second semiconductor layers on the respective light-emitting layers.

16. The display device of claim 15, wherein an upper surface of each of the plurality of reflectors is disposed at a same height with an upper surface of the second semiconductor layers.

17. The display device of claim 15, wherein an upper surface of each of the plurality of reflectors is disposed at a higher height than an upper surface of the second semiconductor layers.

* * * * *

UNITED STATES PATENT AND TRADEMARK OFFICE
CERTIFICATE OF CORRECTION

| | | |
|---|---|---|
| PATENT NO. | : 11,721,718 B2 | Page 1 of 1 |
| APPLICATION NO. | : 17/206011 | |
| DATED | : August 8, 2023 | |
| INVENTOR(S) | : Joonyeong Park et al. | |

It is certified that error appears in the above-identified patent and that said Letters Patent is hereby corrected as shown below:

In the Claims

Column 21, Claim 6, Lines 63-64:
"the display device of claim 1, further comprising:"
Should read:
--the display device further comprising:--.

Signed and Sealed this
Sixteenth Day of July, 2024

Katherine Kelly Vidal
*Director of the United States Patent and Trademark Office*